United States Patent
Cok

(10) Patent No.: US 9,417,385 B2
(45) Date of Patent: *Aug. 16, 2016

(54) IMPRINTED MULTI-LEVEL MICRO-WIRE CIRCUIT STRUCTURE METHOD

(71) Applicant: Eastman Kodak Company, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 438 days.

This patent is subject to a terminal disclaimer.

(21) Appl. No.: 14/032,239

(22) Filed: Sep. 20, 2013

(65) Prior Publication Data

US 2015/0084200 A1    Mar. 26, 2015

(51) Int. Cl.
| | |
|---|---|
| H01B 13/00 | (2006.01) |
| G02B 6/122 | (2006.01) |
| G02B 6/138 | (2006.01) |
| H05K 3/10 | (2006.01) |
| H05K 3/12 | (2006.01) |
| H01L 23/538 | (2006.01) |
| H01L 21/768 | (2006.01) |
| G02B 6/42 | (2006.01) |

(Continued)

(52) U.S. Cl.
CPC  *G02B 6/122* (2013.01); *G02B 6/13* (2013.01); *G02B 6/138* (2013.01); *G02B 6/4214* (2013.01); *G02B 6/4274* (2013.01); *H01L 21/76895* (2013.01); *H01L 23/5386* (2013.01); *H01L 31/12* (2013.01); *H01L 31/18* (2013.01); *H05K 3/10* (2013.01); *H05K 3/101* (2013.01); *H05K 3/1258* (2013.01); *G02B 2006/121* (2013.01); *G02B 2006/12104* (2013.01); *G02B 2006/12126* (2013.01); *G02B 2006/12147* (2013.01); *G06F 3/044* (2013.01); *H01L 2924/0002* (2013.01); *H05K 1/0274* (2013.01); *H05K 3/32* (2013.01); *H05K 2201/0108* (2013.01); *H05K 2201/09036* (2013.01); *H05K 2201/10356* (2013.01); *H05K 2203/0108* (2013.01)

(58) Field of Classification Search
CPC ....... H05K 3/10; H05K 3/101; H05K 3/0298; H05K 3/1275
USPC ............. 216/13, 17, 18, 39, 54; 438/717, 720
See application file for complete search history.

(56) References Cited

U.S. PATENT DOCUMENTS

| 4,859,813 A | 8/1989 | Rockwell |
|---|---|---|
| 7,202,179 B2 | 4/2007 | Taussig et al. |

(Continued)

FOREIGN PATENT DOCUMENTS

| CN | 102063951 | 7/2013 |
|---|---|---|
| DE | 196 25 386 A1 | 1/1998 |
| EP | 2 505 344 A2 | 10/2012 |

*Primary Examiner* — Binh X Tran
(74) *Attorney, Agent, or Firm* — Raymond L. Owens; Kevin E. Spaulding

(57) ABSTRACT

A method of making a multi-level micro-wire structure includes imprinting first micro-channels in a curable first layer over a substrate with a first stamp, curing the first layer, and locating and curing a curable conductive ink in the first micro-channels to form first micro-wires. Second micro-channels are imprinted in a curable second layer in contact with the first layer with a second stamp, the second layer is cured, and a curable conductive ink is located and cured in the second micro-channels to form second micro-wires. At least one of the second micro-channels contacts at least one first micro-wire and a second micro-wire in at least one of the second micro-channels is in electrical contact with at least one first micro-wire.

20 Claims, 44 Drawing Sheets

(51) Int. Cl.
  G02B 6/13   (2006.01)
  H01L 31/12  (2006.01)
  H01L 31/18  (2006.01)
  H05K 1/02       (2006.01)
  G06F 3/044      (2006.01)
  H05K 3/32       (2006.01)
  G02B 6/12       (2006.01)

(56) References Cited

U.S. PATENT DOCUMENTS

| | | |
|---|---|---|
| 8,179,381 B2 | 5/2012 | Frey et al. |
| 9,101,056 B2 * | 8/2015 | Cok ................. H05K 3/4685 |
| 2005/0142345 A1 | 6/2005 | Jayaraman |
| 2006/0055864 A1 | 3/2006 | Matsumura et al. |
| 2010/0026664 A1 | 2/2010 | Geaghan |
| 2010/0328248 A1 | 12/2010 | Mozdzyn |
| 2011/0007011 A1 | 1/2011 | Mozdzyn |
| 2011/0099805 A1 | 5/2011 | Lee |
| 2011/0102370 A1 | 5/2011 | Kono et al. |
| 2012/0206421 A1 | 8/2012 | Cok et al. |
| 2014/0054802 A1 * | 2/2014 | Shim ................. H01L 21/561 257/787 |
| 2015/0060394 A1 * | 3/2015 | Cok ................. H05K 3/4685 216/13 |
| 2015/0084201 A1 * | 3/2015 | Cok ................. G02B 6/138 257/773 |

* cited by examiner

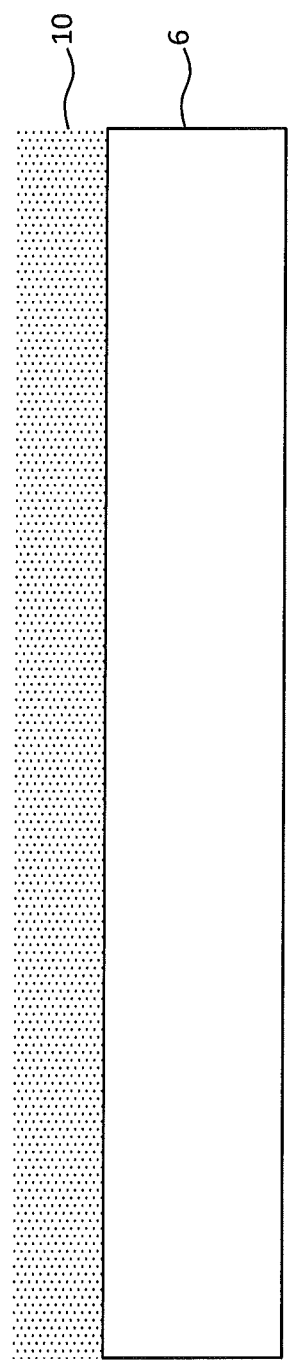
FIG. 18A
FIG. 18B

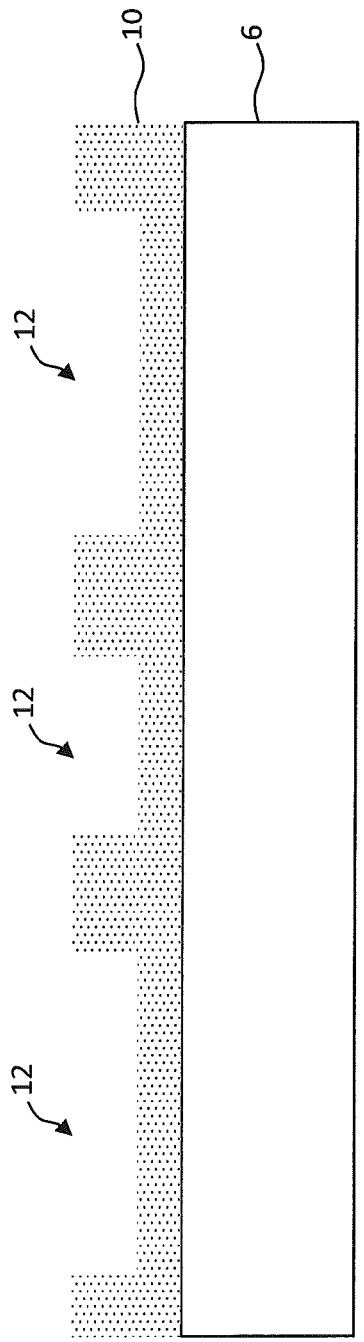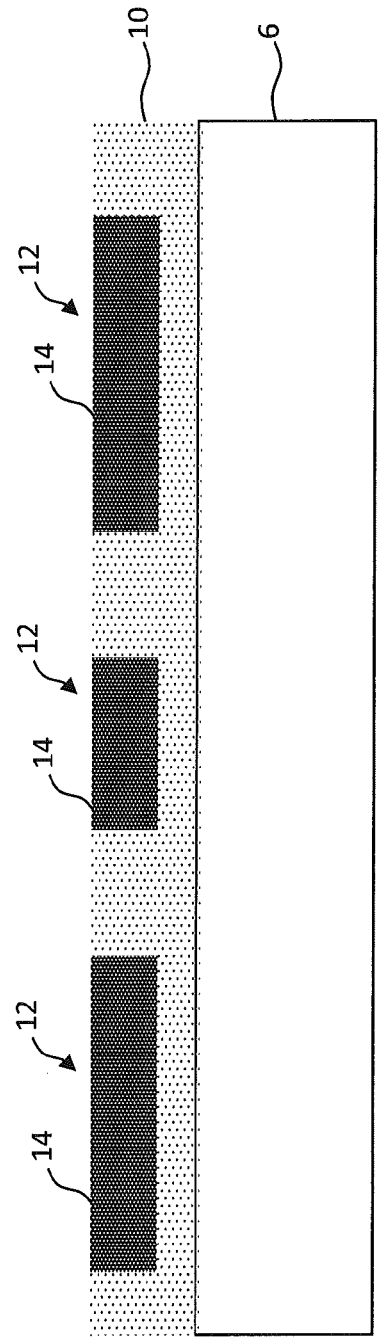
FIG. 18D
FIG. 18E

IMPRINTED MULTI-LEVEL MICRO-WIRE CIRCUIT STRUCTURE METHOD

CROSS REFERENCE TO RELATED APPLICATIONS

Reference is made to commonly-assigned, co-pending U.S. patent application Ser. No. 14/032,235 (now U.S. Patent Application Publication No. 2015/0085456), filed Sep. 20, 2013, entitled "Imprinted Multi-level Micro-Wire Circuit Structure" by Cok et al; commonly-assigned, co-pending U.S. patent application Ser. No. 14/032,250 (now U.S. Patent Application Publication No. 2015/0084201), filed Sep. 20, 2013, entitled "Imprinted Micro-Wire Circuit Multi-level Stamp Method" by Cok, the disclosures of which are incorporated herein.

Reference is made to commonly assigned U.S. patent application Ser. No. 14/012,150, filed Aug. 28, 2013, entitled "Imprinted Multi-level Micro-Structure Method" by Cok et al; commonly assigned U.S. patent application Ser. No. 14/012,216, filed Aug. 28, 2013, entitled "Imprinted Bi-Layer Micro-Structure Method" by Cok; and commonly assigned U.S. patent application Ser. No. 13/784,869, filed Mar. 5, 2013, entitled "Micro-Channel Structure with Variable Depths" by Cok; the disclosures of which are incorporated herein.

FIELD OF THE INVENTION

The present invention relates to transparent circuits having electrically conductive micro-wires formed in multiple layers.

BACKGROUND OF THE INVENTION

Transparent electrical conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Publication 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5μ and 4μ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels is formed in a substrate using an embossing technique. Embossing methods are generally known in the prior art and typically include coating a curable liquid, such as a polymer, onto a rigid substrate. A pattern of micro-channels is imprinted (impressed or embossed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example, using patterned radiation exposure or physical masks. Unwanted material (e.g. photosensitive resist) is removed, followed by electro-deposition of metallic ions in a bath.

Conductive micro-wires are used to form a touch switch, for example, as illustrated in U.S. Patent Publication 2011/0102370. In this example, a capacitive touch switch includes a first substrate on which is formed a first mesh-like electrode and a second substrate on which is formed a second mesh-like electrode. The first and second substrates are integrally bonded via an adhesive layer in such a manner that the first and second mesh-like electrodes face each other. Such a design requires the use of two substrates that are aligned and bonded together.

Multi-level masks are used with photo-lithography to form thin-film devices, for example as disclosed in U.S. Pat. No. 7,202,179. An imprinted 3D template structure is provided over multiple thin films formed on a substrate. The multiple levels of the template structure are used as masks for etching the thin films. This approach requires the use of a mask and multiple photo-lithographic steps.

The use of integrated circuits with electrical circuitry is well known. Various methods for providing integrated circuits on a substrate and electrically connecting them are also known. Integrated circuits can have a variety of sizes and packages. In one technique, Matsumura et al., in U.S. Patent Publication No. 2006/0055864, describes crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown.

Printed circuit boards are well known for electrically interconnecting integrated circuits and often include multiple layers of conductors with vias for electrically connecting conductors in different layers. Circuit boards are often made by etching conductive layers deposited on laminated fiberglass substrates.

SUMMARY OF THE INVENTION

Etching processes are expensive and conventional substrates are not transparent and therefore of limited use in applications for which transparency is important, for example display and touch-screen applications. There is a need, therefore, for further improvements in micro-wire structures for transparent electrodes that provide more complex and interconnected patterns on transparent substrates using simplified manufacturing processes at lower cost.

In accordance with the present invention, a method of making a multi-level micro-wire structure comprises:

forming a curable first layer over a substrate and imprinting a first pattern of first micro-channels in the first layer with a first stamp;

curing the curable first layer to form a cured first layer having the first micro-pattern of first micro-channels imprinted in the cured first layer;

locating a curable conductive ink in the first micro-channels and curing the curable conductive ink to form first micro-wires in the first micro-channels;

forming a curable second layer in contact with the cured first layer and imprinting a second micro-pattern of second micro-channels in the second layer with a second stamp different from the first stamp;

curing the curable second layer to form a cured second layer having the second micro-pattern of second micro-channels imprinted in the cured second layer, at least one of the second micro-channels formed to contact at least one first micro-wire;

locating a curable conductive ink in the second micro-channels and curing the curable conductive ink to form second micro-wires in the first micro-channels; and wherein a second micro-wire in the at least one of the second micro-channels is in electrical contact with the at least one first micro-wire.

The present invention provides multi-level micro-wire structures with improved complexity, connectivity, transparency, and manufacturability. The micro-wire structures of the present invention are particularly useful in transparent touch screens or display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 18A-18I are cross sectional views illustrating sequential steps in a method of the present invention;

The Figures are not drawn to scale since the variation in size of various elements in the Figures is too great to permit depiction to scale.

DETAILED DESCRIPTION OF THE INVENTION

The present invention is directed toward imprinted multi-level micro-wire structures having electrically conductive micro-wires formed in micro-channel structures in multiple layers over a substrate. Micro-wires in different layers are electrically connected together in a variety of configurations. In other embodiments, micro-wires formed in imprinted micro-channels are electrically connected to connection pads on an integrated circuit. The present invention can form transparent circuit structures on or in a transparent substrate. Imprinted structures are also known to those skilled in the art as embossed or impressed structures formed by locating in a curable layer an imprinting, impressing, or embossing stamp having protruding structural features, curing the layer, and then removing the stamp to form micro-channels corresponding to the structural features that are then filled with a conductive ink that is cured to form micro-wires.

Figure 1:
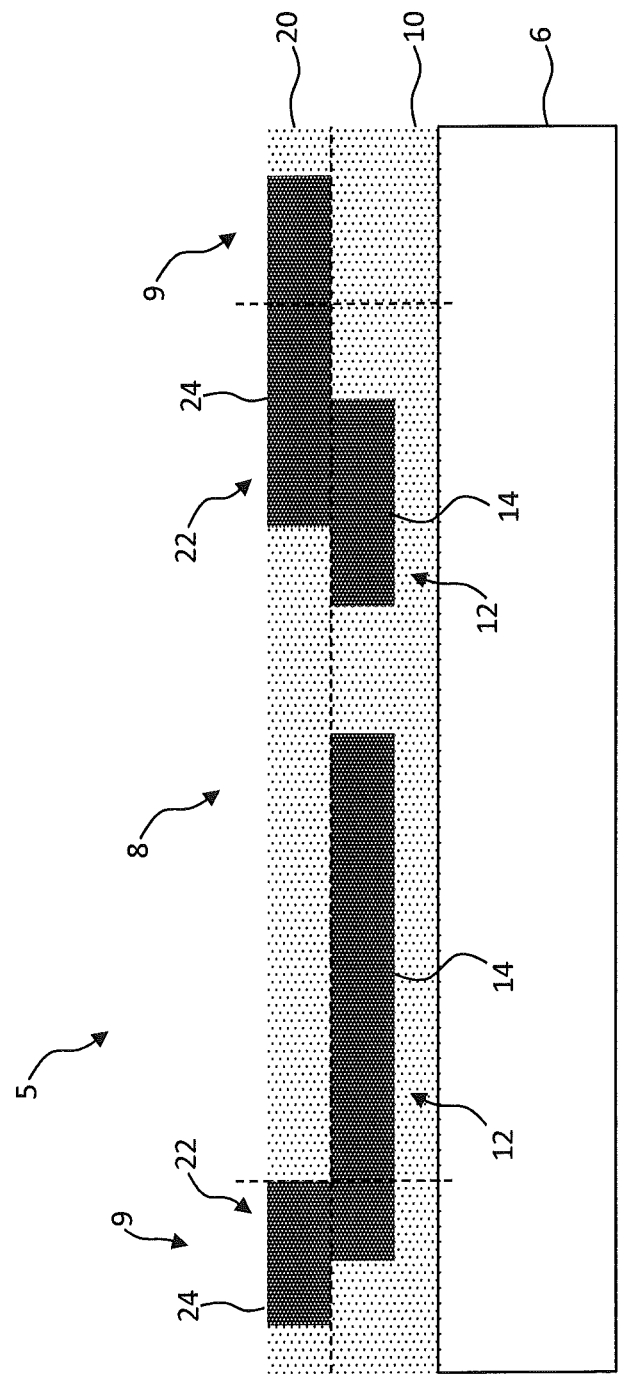
FIGS. 1-9 are cross sectional views of various embodiments of the present invention.

Referring to FIG. 1 in an embodiment of the present invention shown in cross section, an imprinted multi-level micro-wire structure 5 includes a substrate 6 and a first layer 10 formed over the substrate 6. The first layer 10 includes first micro-wires 14 formed in first micro-channels 12 imprinted in the first layer 10. A second layer 20 is formed in contact with the first layer 10. The second layer 20 includes second micro-wires 24 formed in second micro-channels 22 imprinted in the second layer 20. At least one of the second micro-wires 24 is in electrical contact with at least one of the first micro-wires 14. The substrate 6 includes an edge area 9 and a central area 8 separate from the edge area 9. The first and second layers 10, 20 are both located in both the edge area 9 and the central area 8.

As used herein, the term 'over' includes in contact with or spaced from the substrate or layer. As is understood by those knowledgeable in the art, layers formed on a substrate can be above or below the substrate depending on the orientation. The present invention is not limited by the orientation of the substrate 6, and therefore a layer that is on or over the substrate 6 is also considered to be under or beneath the substrate 6.

A substrate 6 is any surface on which a layer is formed and can include glass or plastic layers with or without additional layers formed thereon. In various embodiments, the substrate 6 is transparent, for example transmitting 50%, 80%, 90%, 95% or more of visible light and is rigid or flexible. In the Figures, a horizontal dashed line is used to indicate a separation between layers. However, because the layers (e.g. the first layer 10 and the second layer 20) can include similar or the same materials, the layers can be physically indistinguishable once formed on or over the substrate 6. The edge areas 9 are indicated as separated from the central area 8 by a vertical dashed line. The central area 8 is typically the human-interactive portion over the substrate 6, for example the viewing area of a display or a touch-interactive area of a touch-screen, or the light-sensitive portion of a light-sensitive device. The edge area 9 can be the area in which electrical connections are made or in which buss lines electrically connected to the first or second micro-wires 14, 24 are located. In various products, the edge area 9 is often hidden from view by bezels or other covers to obscure them from a user's view.

Micro-wires illustrated in the Figures are formed in micro-channels and are therefore not readily distinguished in the illustrations. For clarity, the micro-channels in which the micro-wires are formed are labeled with corresponding numbered arrows pointing to the micro-channels; the micro-wires formed in the corresponding micro-channels are labeled with numbered lead lines touching the micro-wires.

According to an embodiment of the present invention, the substrate 6, the first layer 10, and the second layer 20 are transparent and the first and second micro-wires 14, 24 are imperceptible to the unaided human visual system. For example, the first and second micro-wires 14, 24 can be less than 20 microns wide, less than 10 microns wide, less than 5 microns wide, less than 2 microns wide, or less than one micron wide. Furthermore, referring to FIG. 21, in an embodiment the first and second micro-wires 14, 24 are distributed over a visible area 7 of the substrate 6 so that the average amount of light absorbed by the first and second micro-wires 14, 24 in any portion of at least one mm by one mm in the visible area 7 varies by less than 50% over the visible area 7. The visible area 7 can, but does not necessarily, correspond to the central area 8 and excludes the edge area 9. Thus, the first and second micro-wires 14, 24 are distributed relatively uniformly over the substrate 6 so that the imprinted multi-level micro-wire structure 5 (FIG. 1) of the present invention has a uniform appearance.

In another embodiment, the average amount of light absorbed by the first and second micro-wires 14, 24 in any portion of at least one mm by one mm in the visible area 7 varies by less than 25%, 10%, 5%, or 1% over the visible area 7. Likewise, in other embodiments, the average amount of light absorbed by the first and second micro-wires 14, 24 in any portion of at least two mm by two mm, five mm by five mm, or one cm by one cm in the visible area 7 varies by less than 50%, 25%, 10%, 5%, or 1% over the visible area 7.

Figure 21:
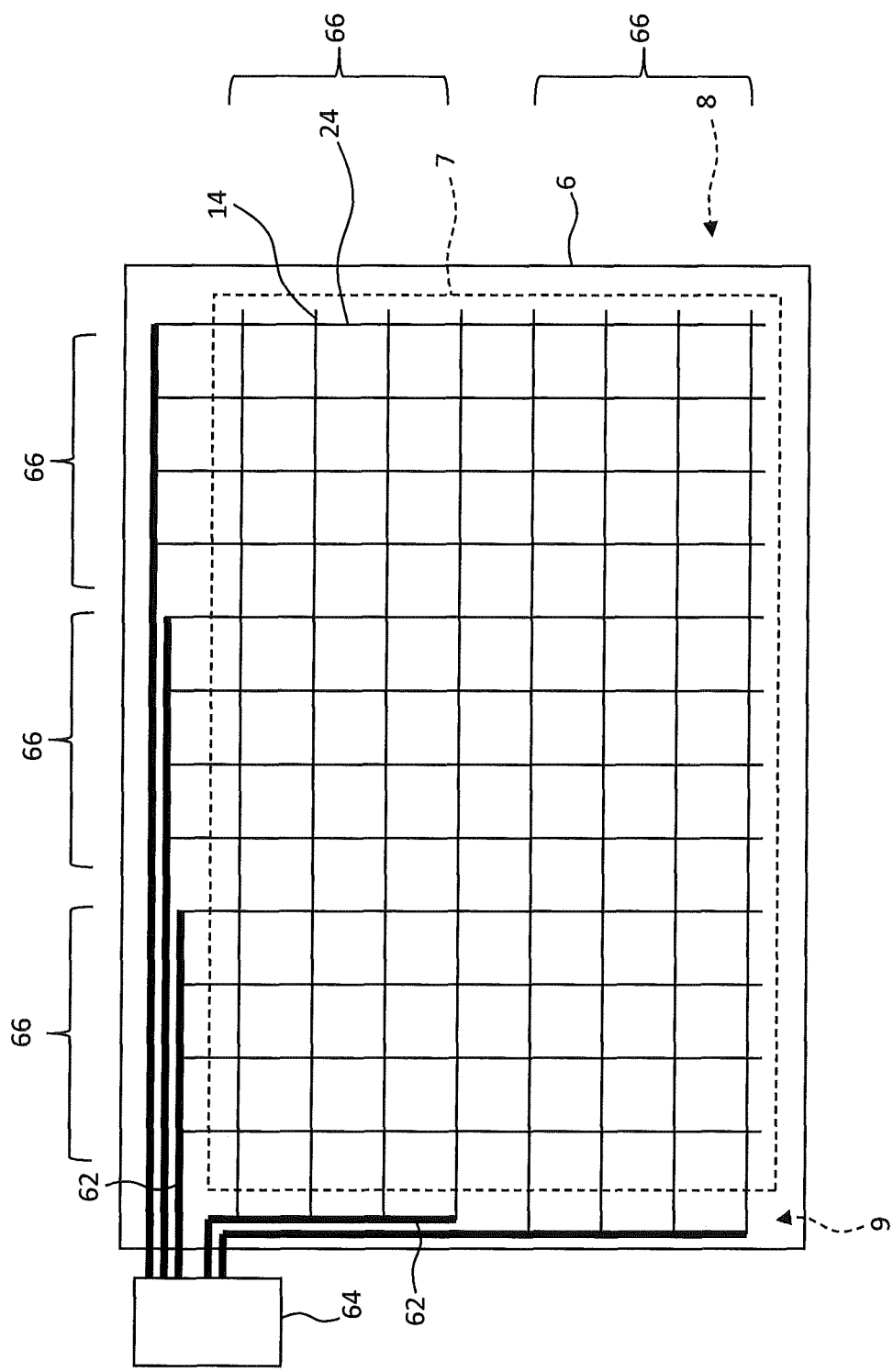
FIG. 21 is a plan view of a substrate according to an embodiment of the present invention.

In other embodiments and as shown in FIG. 1, the imprinted multi-level micro-wire structure 5 includes at least one first micro-wire 14 located in at least a portion of the central area 8 and also located in at least a portion of the edge area 9. At least one second micro-wire 24 is located in at least a portion of the edge area 9 and the at least one second micro-wire 24 is in electrical contact with the at least one first micro-wire 14 in the edge area 9. Thus, for example as shown in FIG. 21, the first and second micro-wires 14, 24 in the visible area 7 corresponding to the central area 8 are electrically connected to busses 62 in the edge area 9 outside the visible area 7 that are electrically connected to connectors and device controllers 64.

Figure 2A:
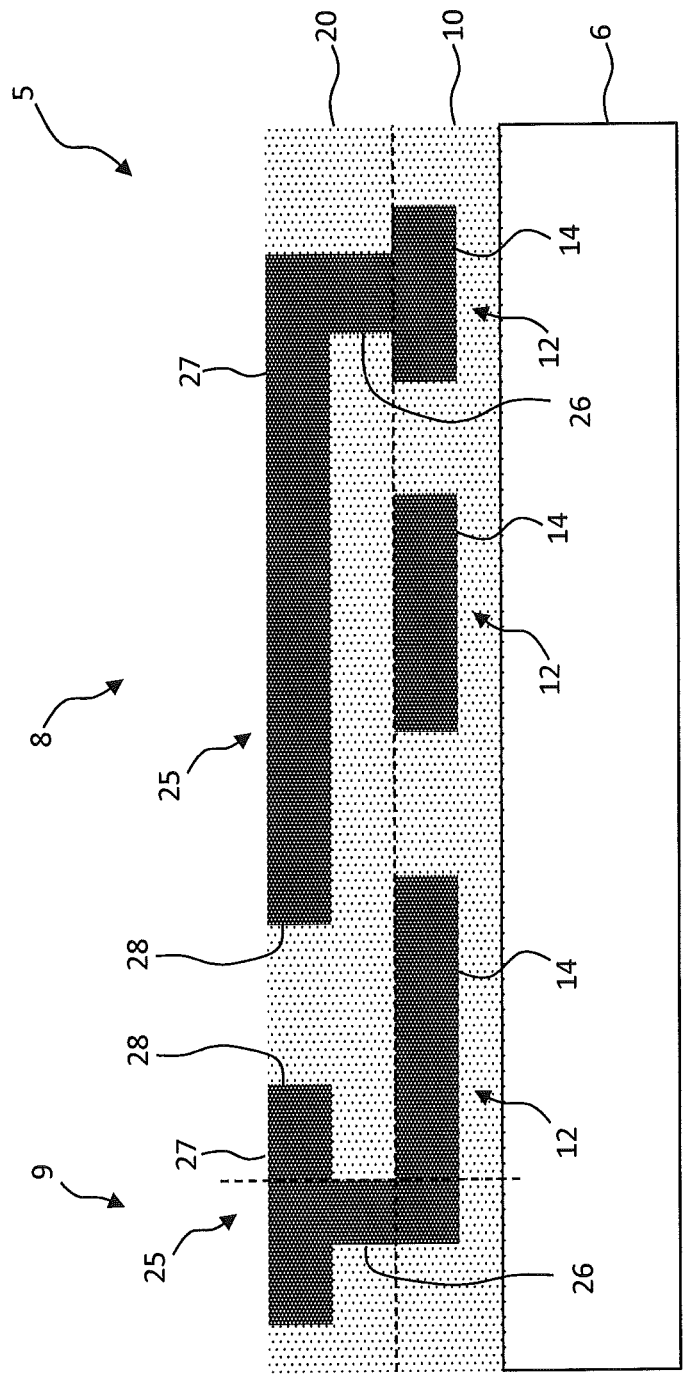
Figure 2B:
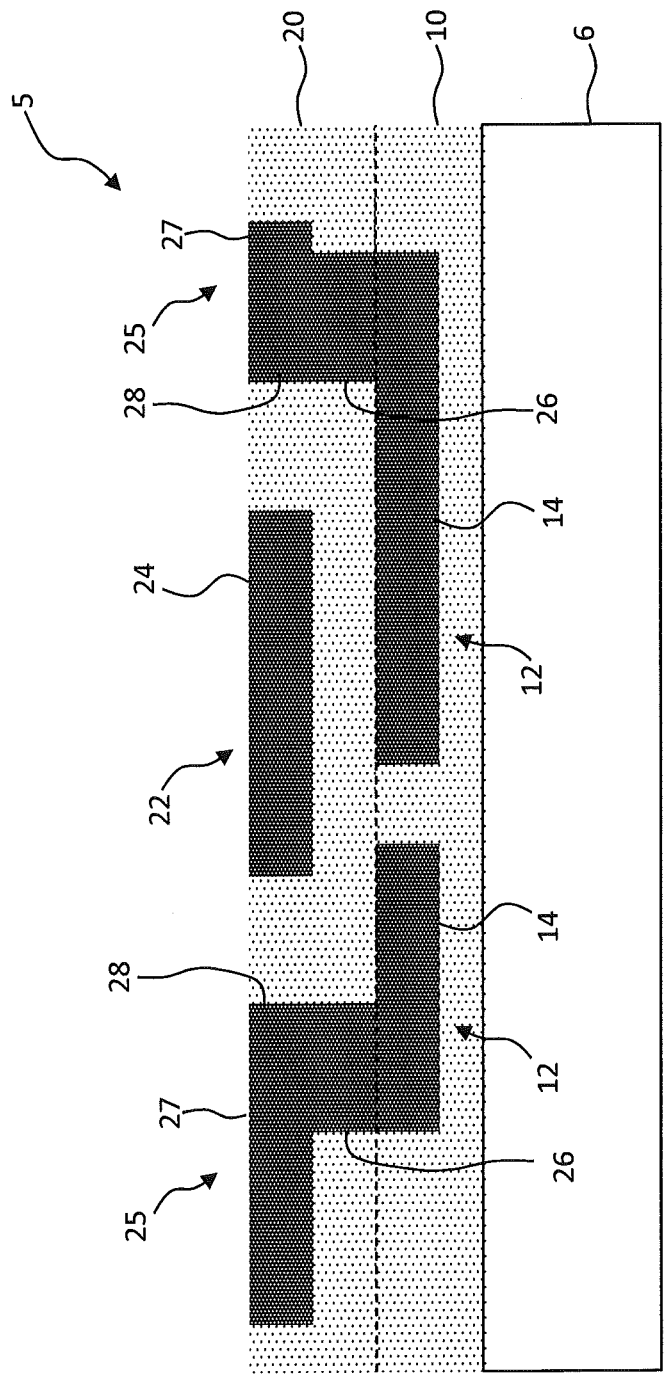

Referring to FIGS. 2A and 2B, in another imprinted multi-level micro-wire structure 5 of the present invention, at least one of the micro-wires in the second layer 20 is a multi-level second micro-wire 27 formed in multi-level second micro-channels 25 imprinted into the second layer 20. A multi-level second micro-wire 27 has at least two portions: a first-level micro-wire portion 26 electrically connected to a second-level micro-wire portion 28. The second-level micro-wire portions 28 are a spatial superset of the first-level micro-wire portions 26 so that the second-level micro-wire portions 28 cover the first-level micro-wire portions 26. In every location over the substrate 6 in the second layer 20 where a first-level micro-wire portion 26 is present, a second-level micro-wire portion 28 is also present. However, where a second-level micro-wire portion 28 is present, a first-level micro-wire portion 26 is not necessarily present. As is also shown in FIG. 2B, the second layer 20 can also include second micro-wires 24 in second micro-channels 22 that are not multi-level second micro-wires 27. The second micro-wires 24 are effectively second-level micro-wire portions 28 without the electrically connected first-level micro-wire portions 26.

In both FIGS. 2A and 2B, the first micro-wires 14 formed in the first micro-channels 12 in the first layer 10 on or over the substrate 6 are as described with reference to FIG. 1. In FIG. 2A, first micro-wires 14 are located between second-level micro-wire portions 28 of the multi-level second micro-wires 27 and the substrate 6. In FIG. 2B, the first micro-wires 14 are located between the second micro-wire 24 and the substrate 6. Thus, a multi-level second micro-wire 27 and a first micro-wire 14 are located over or under a common portion of the substrate 6 without touching. The edge area 9 and the central area 8 are also indicated in FIG. 2A.

Figure 3:
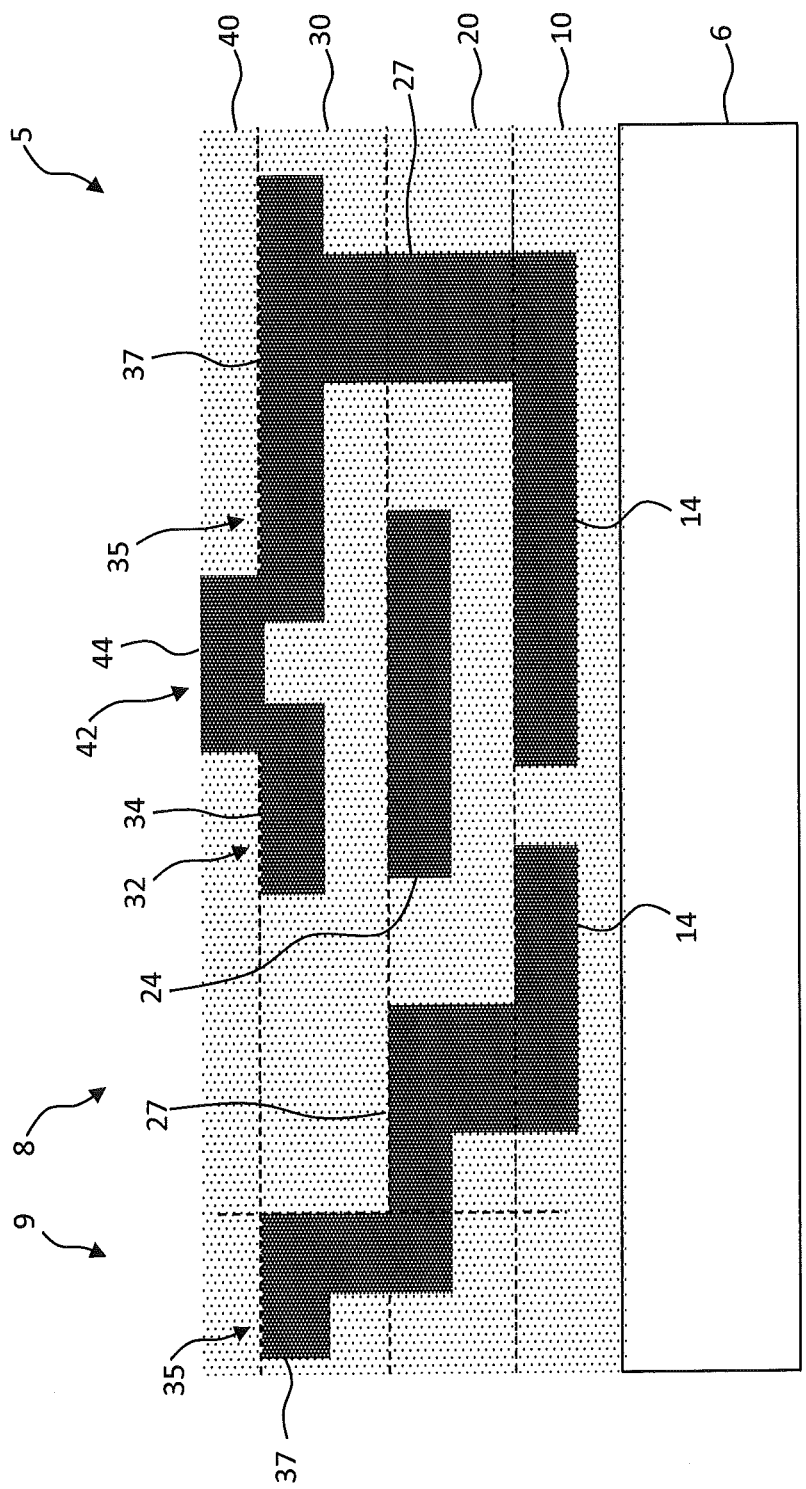

Referring to FIG. 3 in another embodiment, the imprinted multi-level micro-wire structure 5 further includes a third layer 30 formed in contact with the second layer 20 and over the first layer 10 and the substrate 6. The third layer 30 includes third micro-wires 34 formed in third micro-channels 32 imprinted in the third layer 30. In the example structure illustrated, at least one of the third micro-wires 34 is in electrical contact with at least one first micro-wire 14 and is also in electrical contact with at least one multi-level second micro-wire 27 in either the central area 8 or in the edge area 9. The third layer 30 can include multi-level third micro-wires 37 formed in multi-level third micro-channels 35.

A wide variety of spatial arrangements of the first, second, and third micro-wires 14, 24, 34 are included in the present invention. For example, as shown in FIG. 3, a portion of a first micro-wire 14 is between a portion of a second micro-wire 24 and the substrate 6 without the portion of the first micro-wire 14 contacting the portion of the second micro-wire 24.

In yet another embodiment, and as is also shown in FIG. 3, the imprinted multi-level micro-wire structure 5 further includes a fourth layer 40 formed in contact with the third layer 30, the fourth layer 40 including fourth micro-wires 44 formed in fourth micro-channels 42 imprinted in the fourth layer 40. At least one of the fourth micro-wires 44 is in electrical contact with at least one of the first, second, or third micro-wires 14, 24, 34 or multi-level second or multi-level third micro-wires 27, 37.

In other embodiments of the present invention illustrated in FIGS. 4-9, the imprinted multi-level micro-wire structure 5 includes an integrated circuit 70 formed on an integrated circuit substrate 72 distinct and separate from the substrate 6, for example a semiconductor substrate such as silicon formed in a semiconductor fabrication facility separately from the substrate 6 that is, for example, glass. The integrated circuit 70 includes a connection pad 74. The integrated circuit 70 is located on or in the first layer 10. The integrated circuit 70 can include digital or analog electrical circuits electrically connected to one or more of a plurality of the connection pads 74. For example, the integrated circuit 70 is a digital logic circuit.

Figure 6:
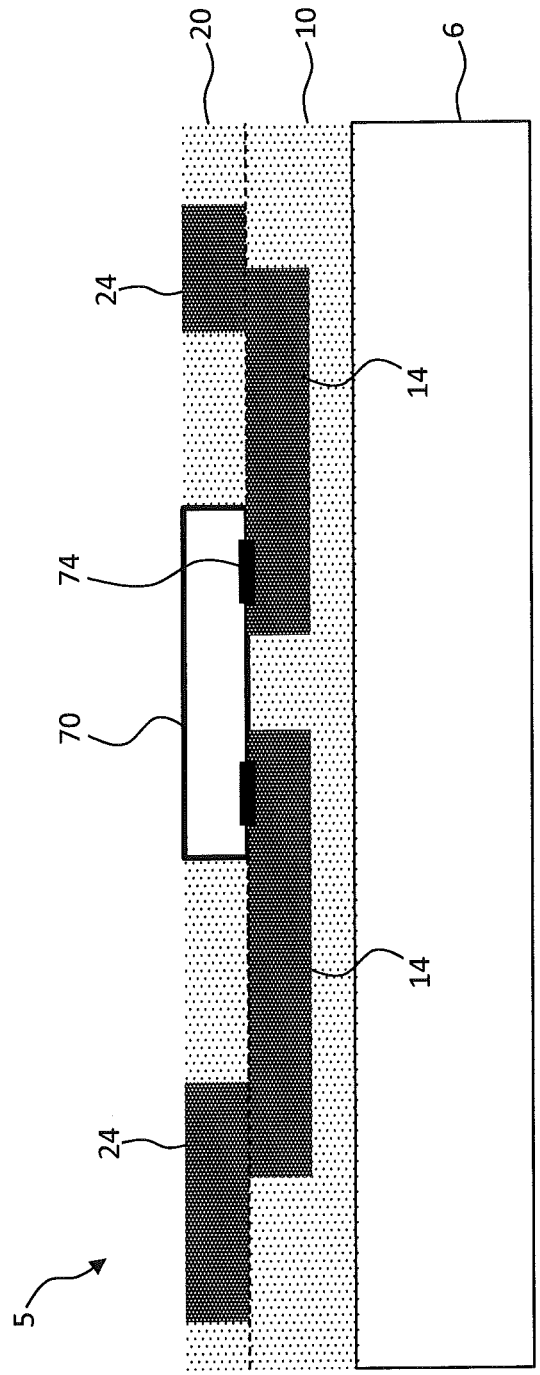
Figure 7:
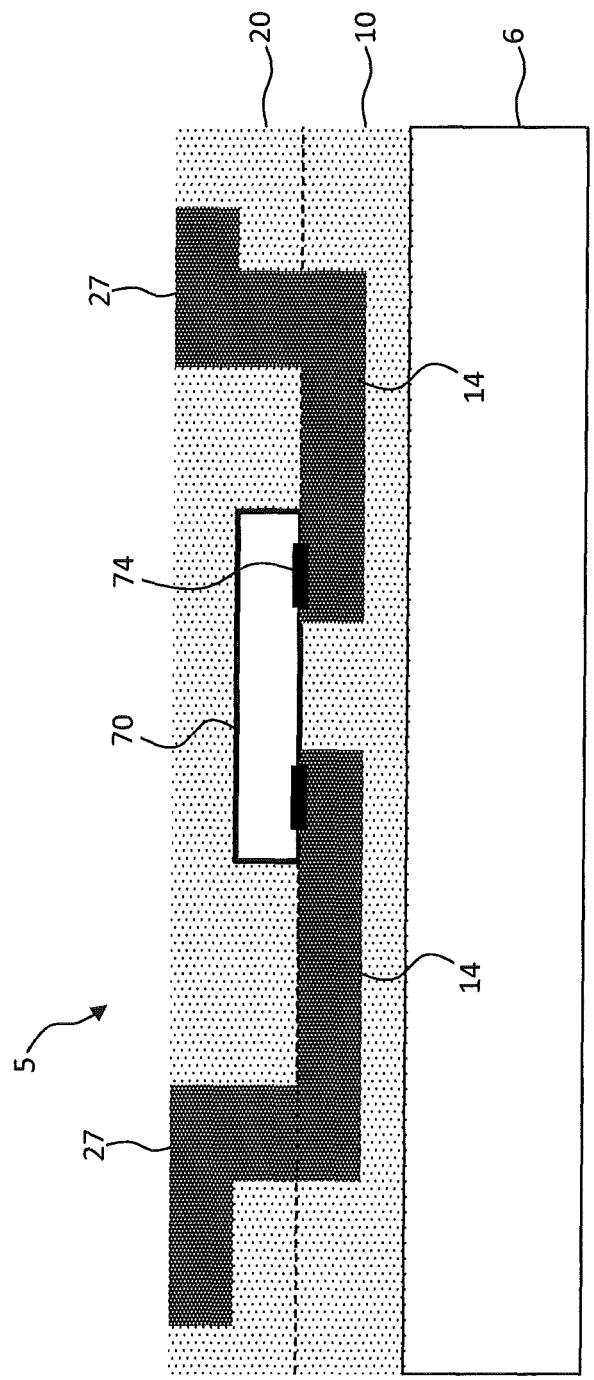
Figure 8:
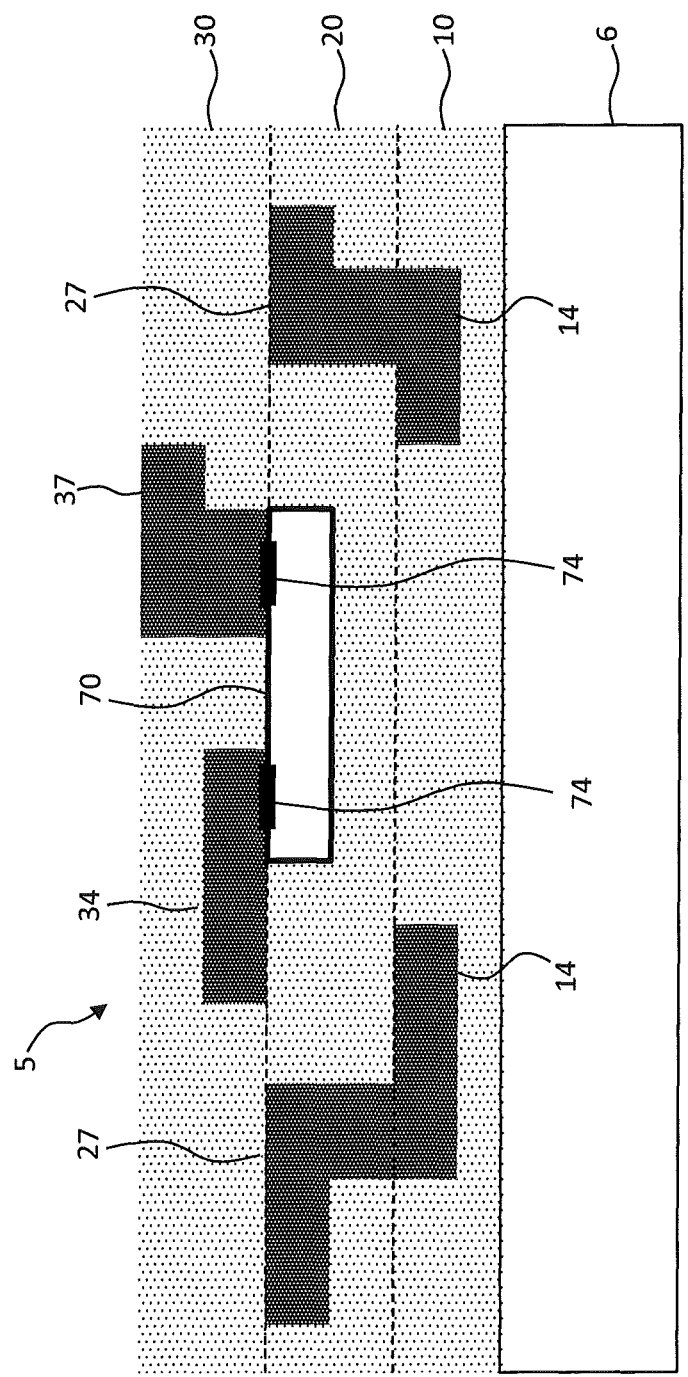
Figure 9:
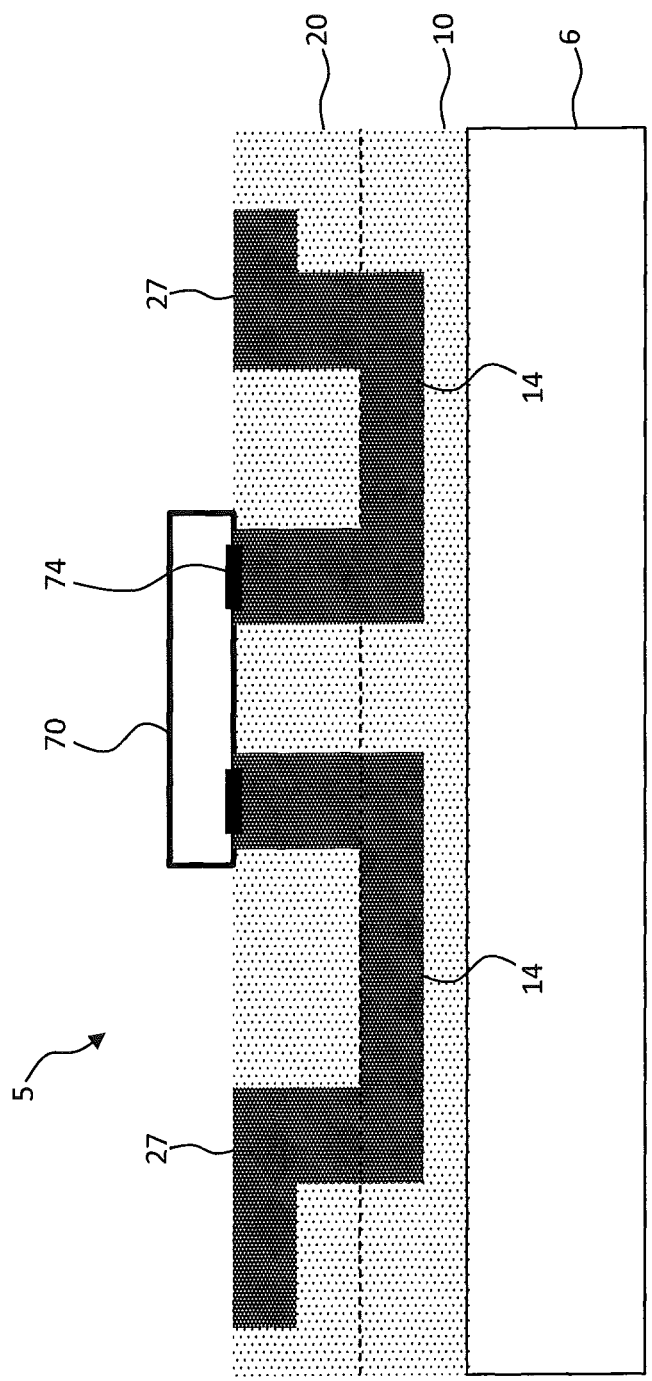

The first layer 10 also includes the first micro-wires 14 and the second layer 20, formed on the first layer 10, includes the second micro-wires 24 (FIGS. 4, 5, and 6) or the multi-level second micro-wires 27 (FIGS. 7, 8, and 9). In various embodiments, the connection pad 74 is electrically connected to a first micro-wire 14 (FIGS. 4, 6, and 7), a second micro-wire 24 (FIG. 5), or a multi-level second micro-wire 27 (FIG. 9). In yet another embodiment referring to FIG. 8, the connection pad 74 is not connected to the first micro-wires 14, multi-level second micro-wires 27, or second micro-wires 24 (FIG. 3) but is instead connected to the third or fourth micro-wires 34, 44 (FIG. 3), or the multi-level third micro-wires 37.

Figure 4:
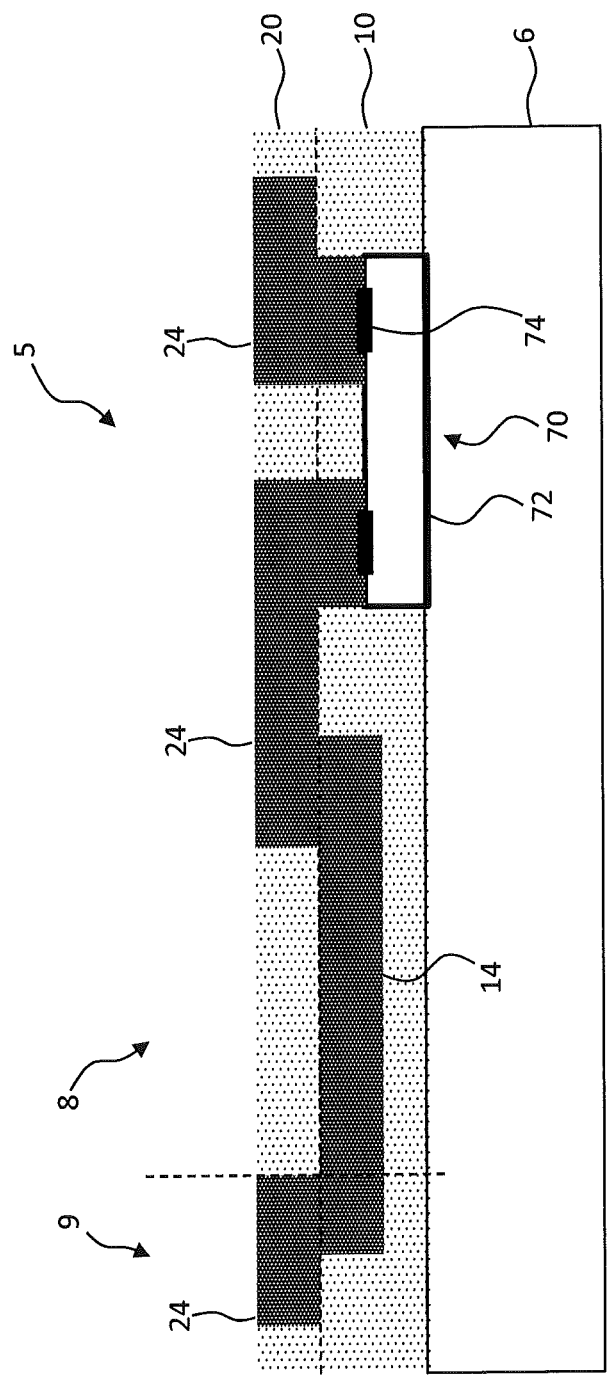
Figure 5:
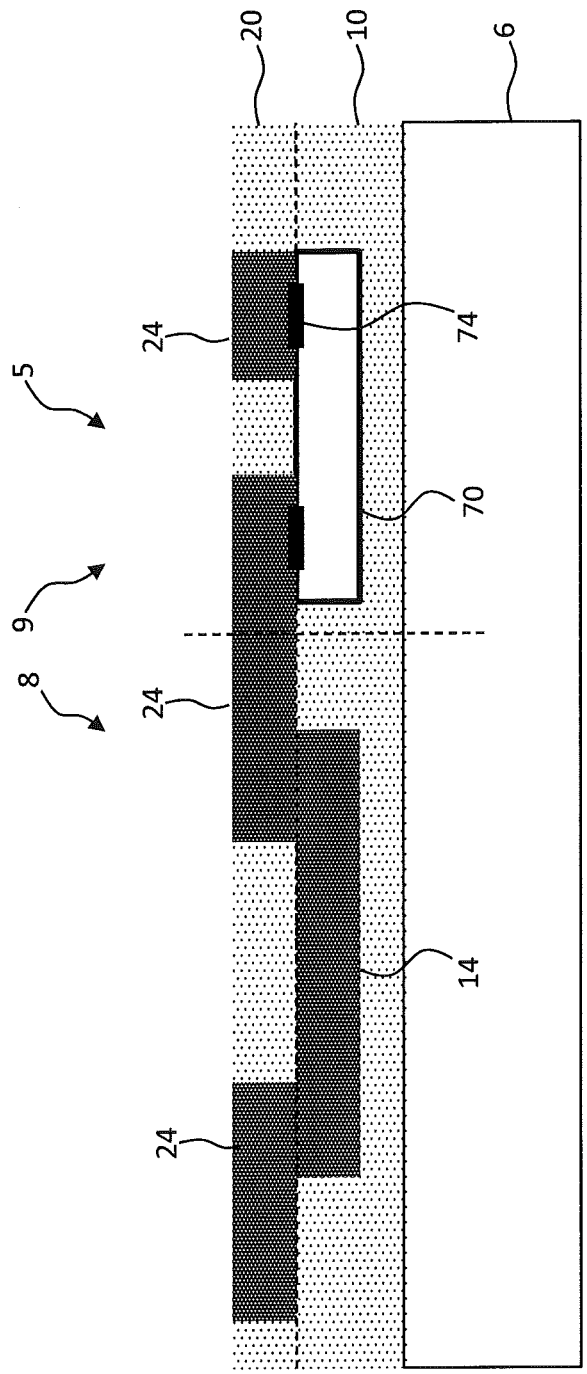

The integrated circuits 70 of embodiments of the present invention can be placed in a variety of locations and with different orientations. For example, as shown in FIG. 4, the integrated circuit 70 is located on the substrate 6 and oriented with the connection pads 74 on a side of the integrated circuit 70 opposite the substrate 6. The integrated circuit 70 is in the first layer 10 and beneath portions of the first layer 10. The first micro-wires 14 are electrically connected to the connection pads 74. Referring to FIG. 5, the integrated circuit 70 is in the first layer 10 and above portions of the first layer 10 and oriented with the connection pads 74 on a side of the integrated circuit 70 opposite the substrate 6. The second micro-wires 24 are electrically connected to the connection pads 74.

Referring to the embodiments of FIGS. 6 and 7, the integrated circuit 70 is in the second layer 20 and above the first layer 10 and oriented with the connection pads 74 on a side of the integrated circuit 70 facing the substrate 6. The first micro-wires 14 in the first layer 10 are electrically connected to the connection pads 74. As shown in FIG. 7, portions of the second layer 20 are over the integrated circuit 70 and the multi-level second micro-wires 27 in the second layer 20.

Referring to the embodiment of FIG. 8, the integrated circuit 70 is in the second layer 20 and above portions of the second layer 20 and oriented with the connection pads 74 on a side of the integrated circuit 70 opposite the substrate 6. The third micro-wires 34 or the multi-level third micro-wires 37 in the third layer 30 are electrically connected to the connection pads 74.

Referring to the embodiment of FIG. 9, the integrated circuit 70 is on the second layer 20 on a side of the second layer 20 opposite the substrate 6 and oriented with the connection pads 74 on a side of the integrated circuit 70 facing the substrate 6. The multi-level second micro-wires 27 in the second layer 20 are electrically connected to the connection pads 74.

In one embodiment, the integrated circuit 70 is located in the central area 8, as shown in FIG. 4. In another embodiment, the integrated circuit 70 is located in the edge area 9 (FIG. 5).

The imprinted multi-level micro-wire structure 5 is useful in constructing electronic systems formed on the substrate 6. In one embodiment, referring to FIGS. 10 and 11, the imprinted multi-level micro-wire structure 5 further includes a plurality of radiation-active elements 50 located in relation to the substrate 6. The integrated circuit 70 is located between the radiation-active elements 50. Radiation-active elements 50 can include elements that respond to, modify, or provide electromagnetic radiation, including but not limited to visible light, ultra-violet radiation, infra-red radiation, micro-wave radiation, radio waves, or x-ray radiation. In an embodiment, the radiation-active elements 50 are light-emitting or light-reflecting elements, for example as found in a display. In another embodiment, the light-active elements 50 are light-responsive elements, for example as found in a sensor.

Figure 10:
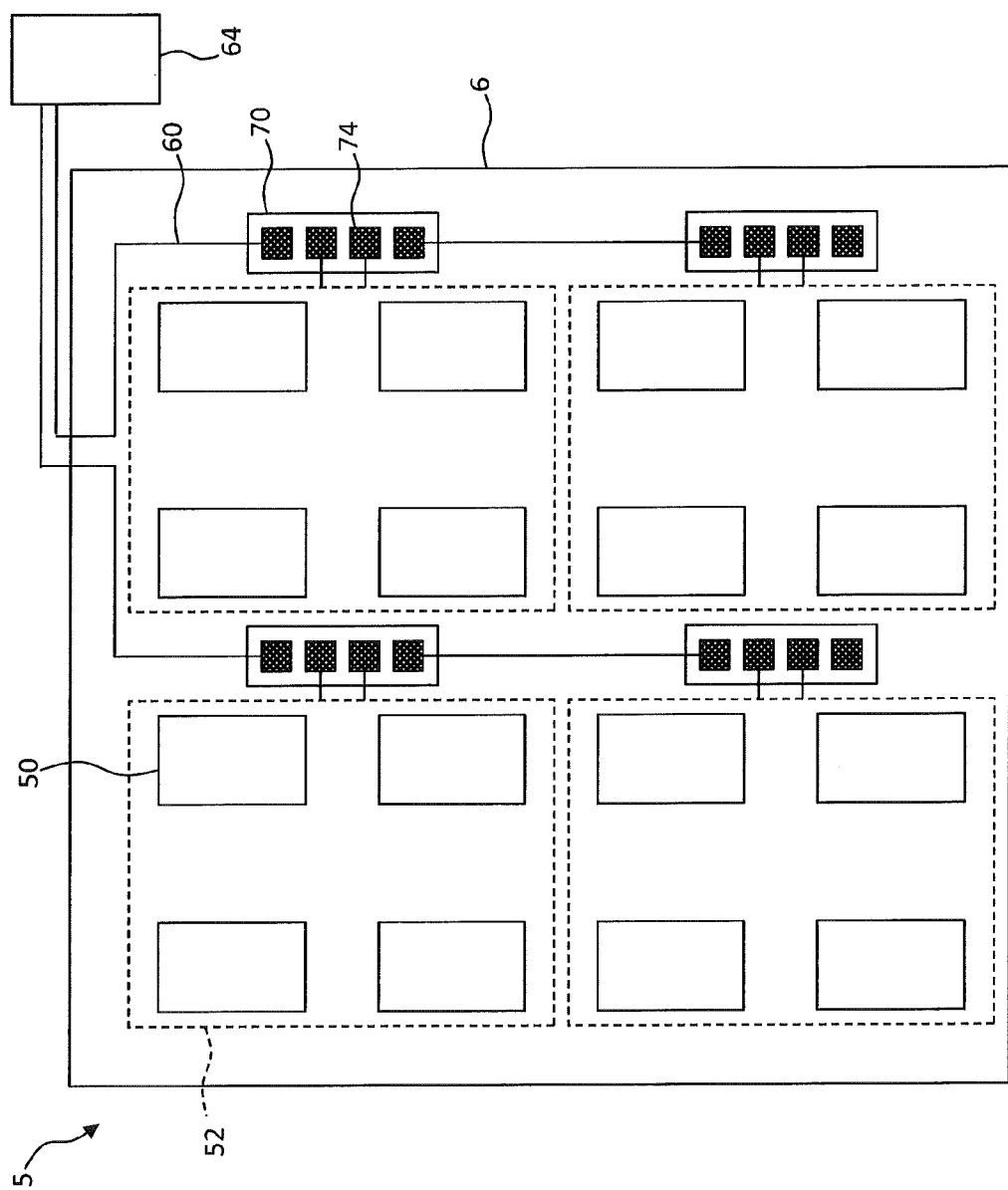
FIGS. 10-11 are plan views of other embodiments of the present invention corresponding to FIG. 1.
Figure 11:
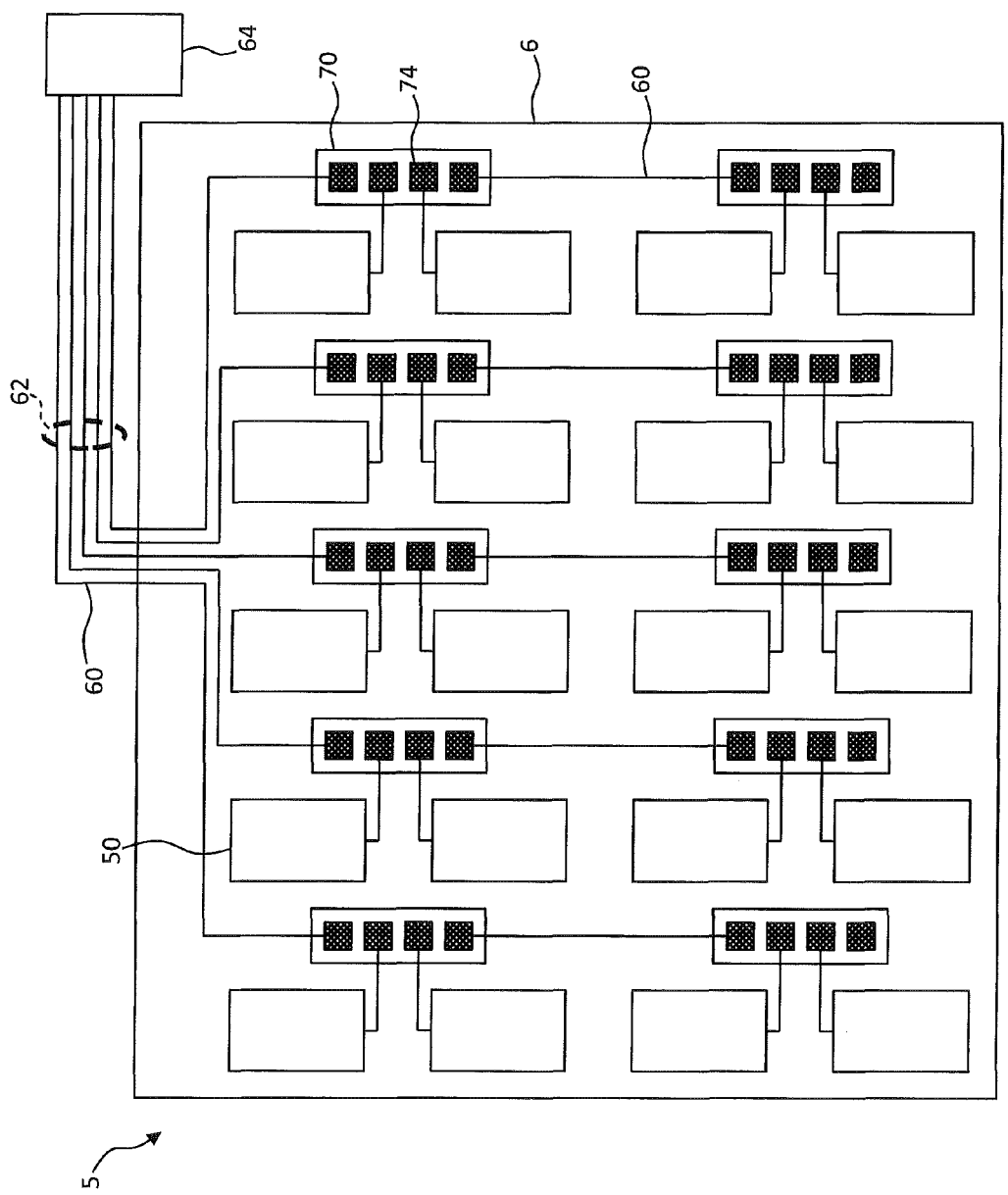

As shown in FIGS. 10 and 11, an array of radiation-active elements 50 in an imprinted multi-level micro-wire structure 5 is distributed over the substrate 6. Integrated circuits 70 having connection pads 74 interconnected with wires 60 are located between columns of radiation-active elements 50. In an embodiment, wires 60 are micro-wires, for example first, second, third, or fourth micro-wires 14, 24, 34, 44 (FIG. 3). In the embodiment of FIG. 10, groups of radiation-active elements 50 form interactive elements 52, for example touch-sensitive areas having transparent electrodes 66 (FIG. 21) controlled through wires 60 connected to the connection pads 74 of the integrated circuits 70. The transparent electrodes can also include micro-wires, for example first, second, third, or fourth micro-wires 14, 24, 34, 44 (FIG. 3). A controller 64 connected through the wires 60 to the integrated circuits 70 electronically controls the integrated circuits 70. The integrated circuits 70 control the touch-sensitive interactive elements 52. In an embodiment, the touch-sensitive interactive elements 52 include one or more sets of transparent electrodes 66 (shown in FIG. 21) forming a touch sensor, for example a capacitive touch sensor. The transparent electrodes 66 can include an interconnected mesh of micro-wires.

As shown in FIG. 11, the radiation-active elements 50 are light-emitting or light-reflecting pixels in a display or are light-sensitive elements in a sensor, for example an imaging sensor. The radiation-active elements 50 are controlled through wires 60 connected to the connection pads 74 of integrated circuits 70. A controller 64 connected through the wires 60 forming a buss 62 to the integrated circuits 70 electronically controls the integrated circuits 70.

The integrated circuits 70 can be small with respect to the radiation-sensitive elements 50 or spacing between radiation-sensitive elements 50, for example having a width less than 100 microns, less than 50 microns, or less than 20 microns, or less than 12 microns. The wires 60 can enable a controller 64 using digital serial control to provide control signals to the integrated circuits 70 and respond to signals from the integrated circuits 70. The integrated circuits 70 can be serially connected in columns, rows, or in both rows and columns. Alternatively, rows of integrated circuits 70 are controlled in parallel, columns of integrated circuits 70 are controlled in parallel, or all of the integrated circuits 70 are controlled in parallel.

Figure 22:
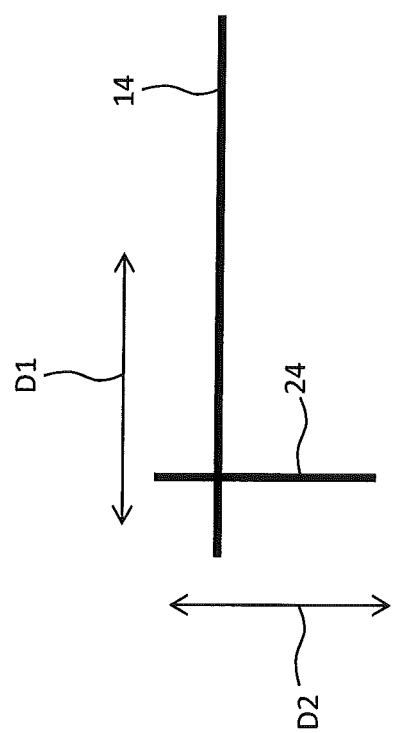
FIG. 22 is a plan view of a first micro-wire and second micro-wire useful in an embodiment of the present invention.

Micro-wires of the present invention are not limited to straight lines. Micro-wires can be curved or form rings or waves. Referring to FIG. 22 in an embodiment, a first micro-wire 14 extending in a first direction D1 in one layer that is electrically connected to a second micro-wire 24 extending in a second, different direction D2 in an adjacent layer can extend past the second micro-wire 24 to aid in connecting the first and second micro-wires 14, 24 in the presence of mis-alignment between micro-channels in the different layers. In one embodiment, the first and second directions D1, D2 are orthogonal. In other embodiments, the first and second directions D1, D2 are not orthogonal. The first micro-wire 14 can extend past the second micro-wire 24 by a distance equal to or greater than one times, two times, four times, or eight times, the width of first or second micro-wire 14, 24, or more. Likewise, the second micro-wire 24 can extend past the first micro-wire 14 by a distance equal to or greater than one times, two times, four times, or eight times, the width of first or second micro-wire 14, 24, or more.

As shown in FIG. 21, in another useful embodiment of an imprinted multi-level micro-wire structure 5, micro-wires are patterned in electrically inter-connecting arrays or grids forming apparently transparent electrodes 66. The first micro-wires 14 are arranged orthogonally to the second micro-wires 24. Alternatively, groups of first micro-wires 14 or groups of second micro-wires 24 form apparently transparent electrodes having interconnected mesh arrangements of micro-wires. The first micro-wires 14 and the second micro-wires 24 can each form electrodes 66 that are orthogonal and overlap to form capacitive structures useful in touch screens.

Figure 12:
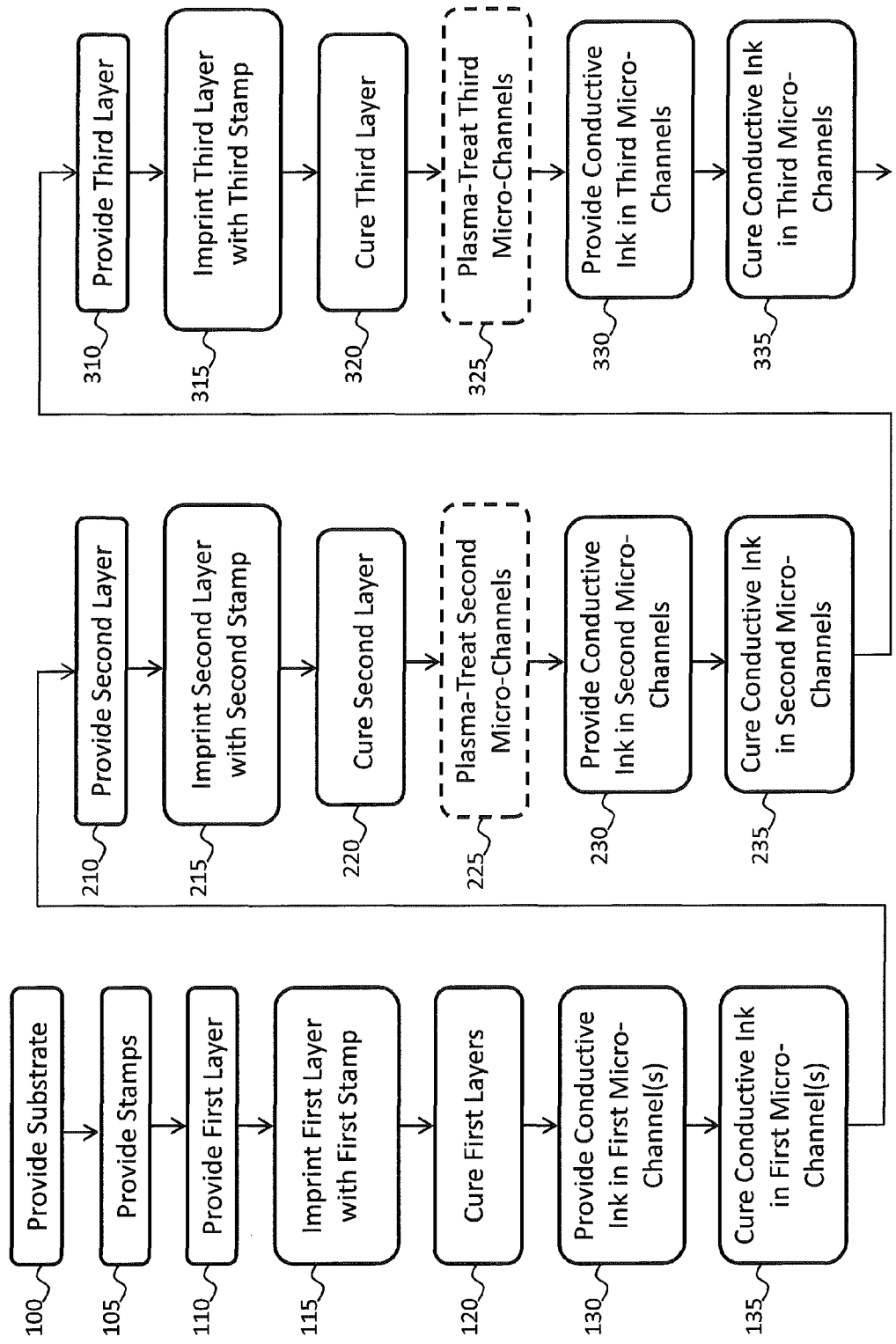
FIGS. 12-13 are flow diagrams illustrating various methods of the present invention.
Figure 13:
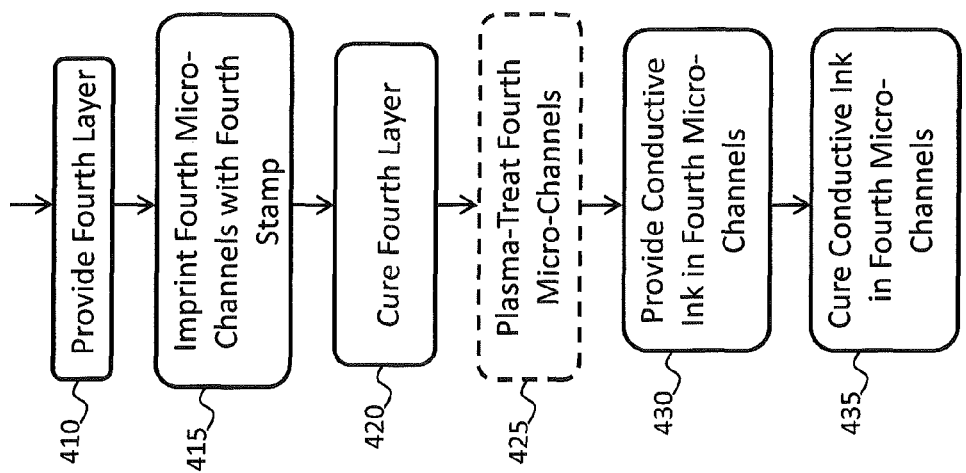
Figure 14A:
FIGS. 14A-14Q are cross sectional views illustrating sequential steps according to various methods of the present invention.
Figure 14B:
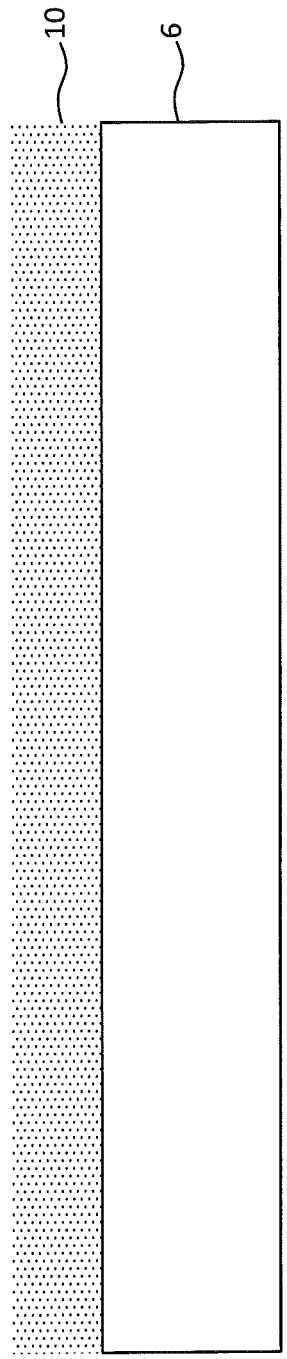
Figure 14C:
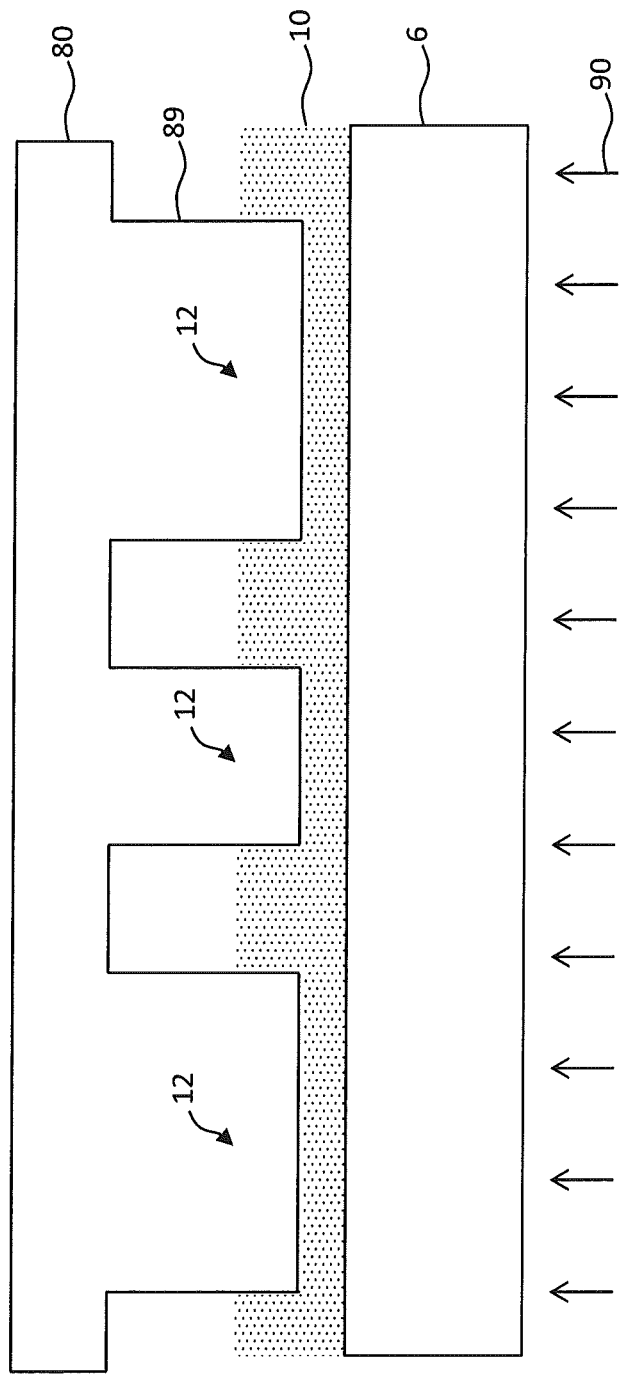
Figure 14D:
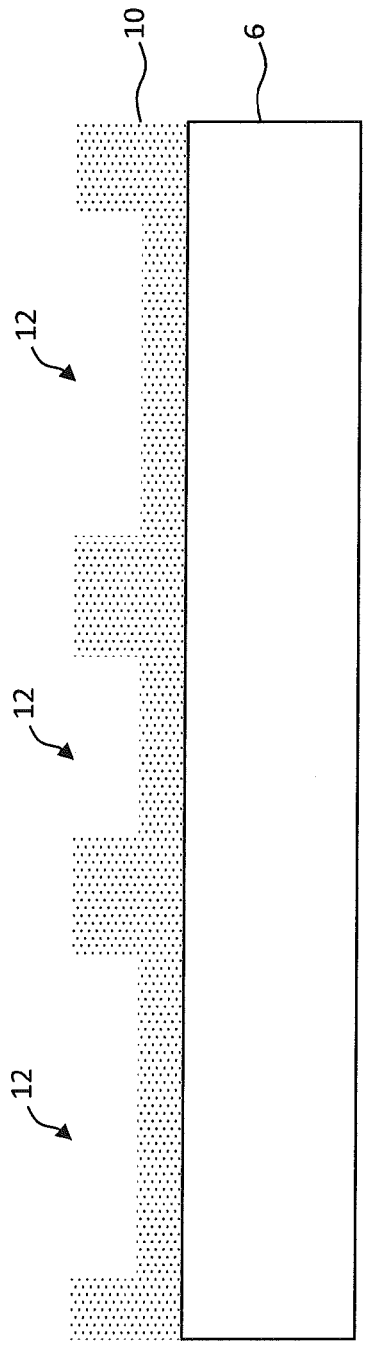
Figure 14E:
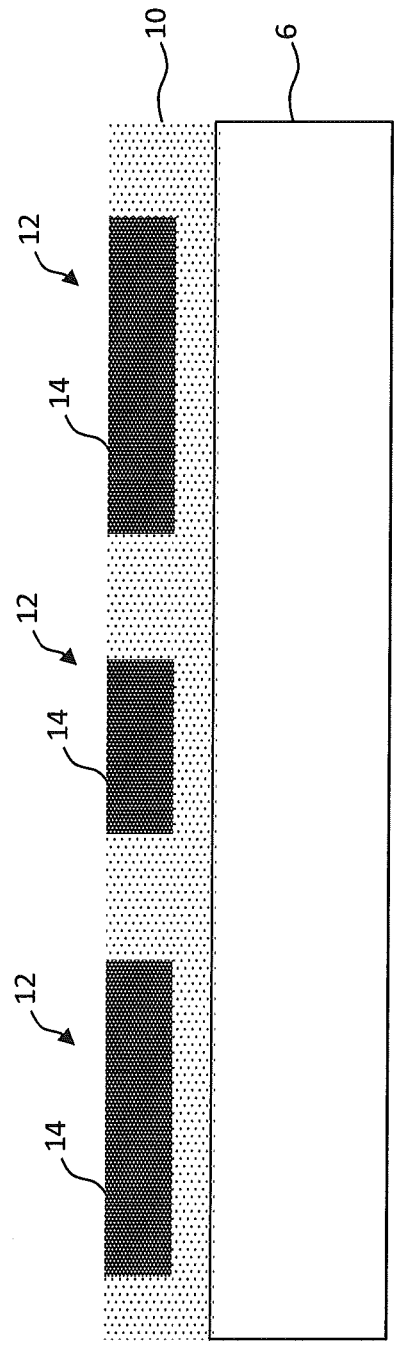
Figure 14F:
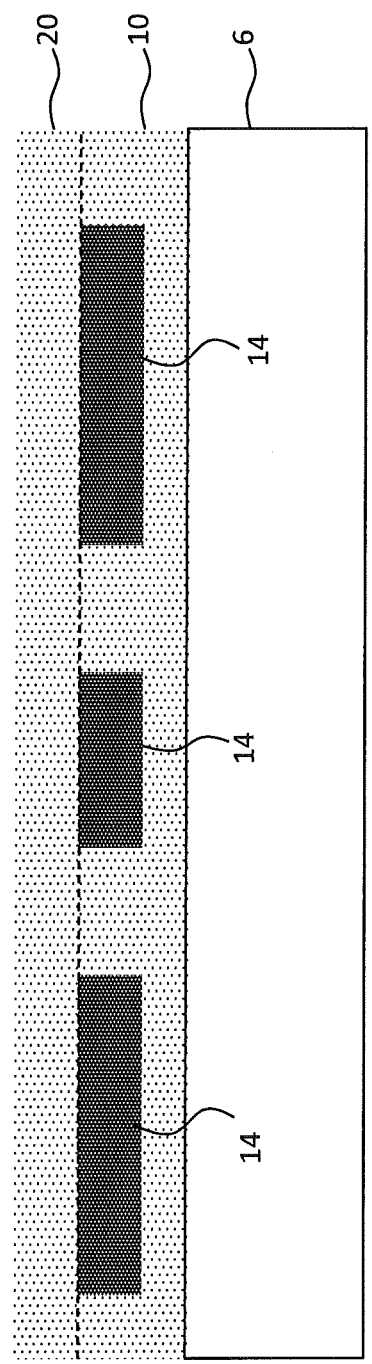
Figure 14G:
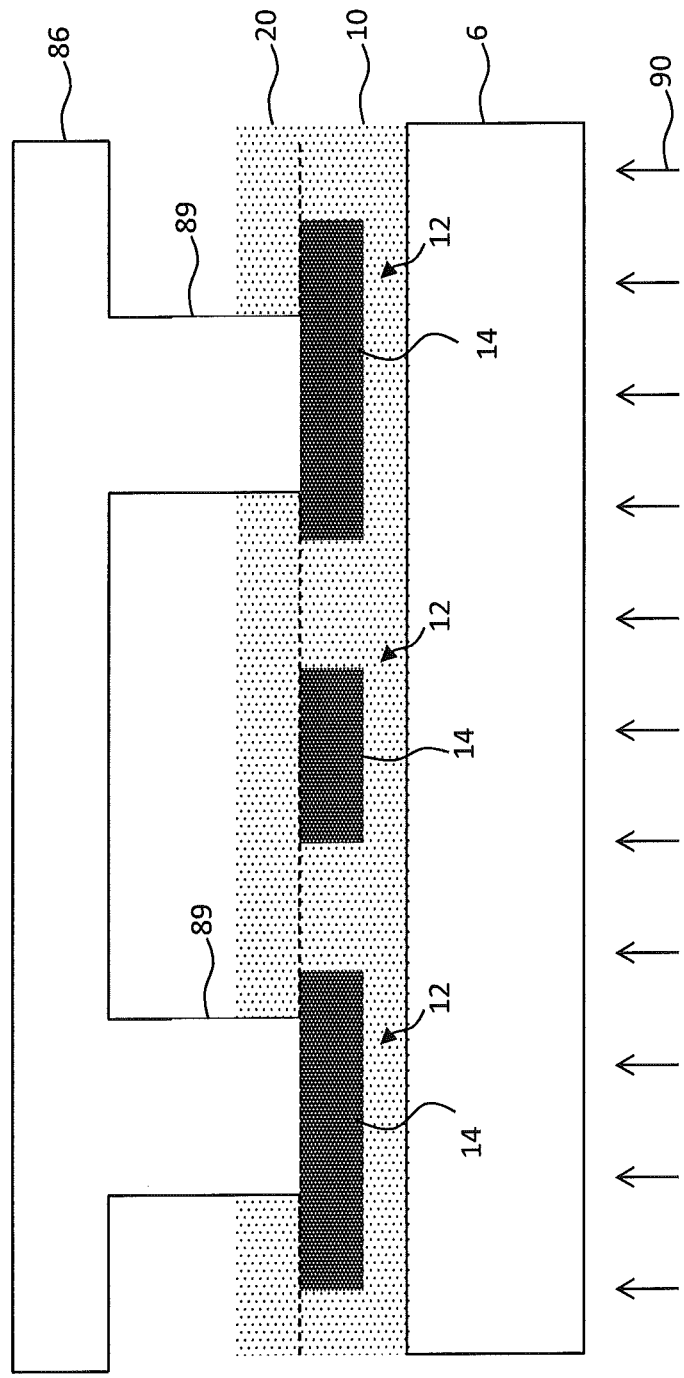
Figure 14H:
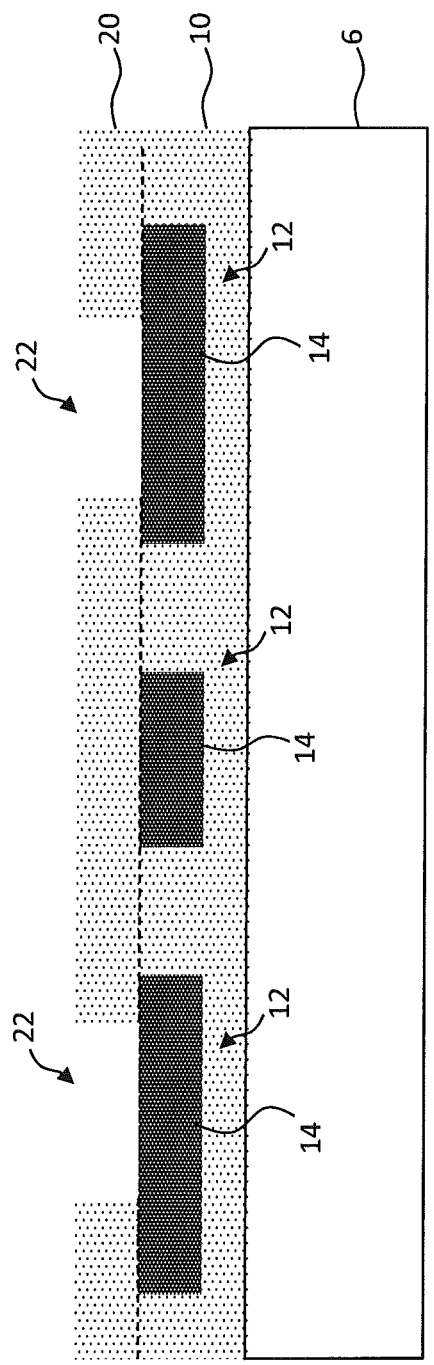
Figure 14I:
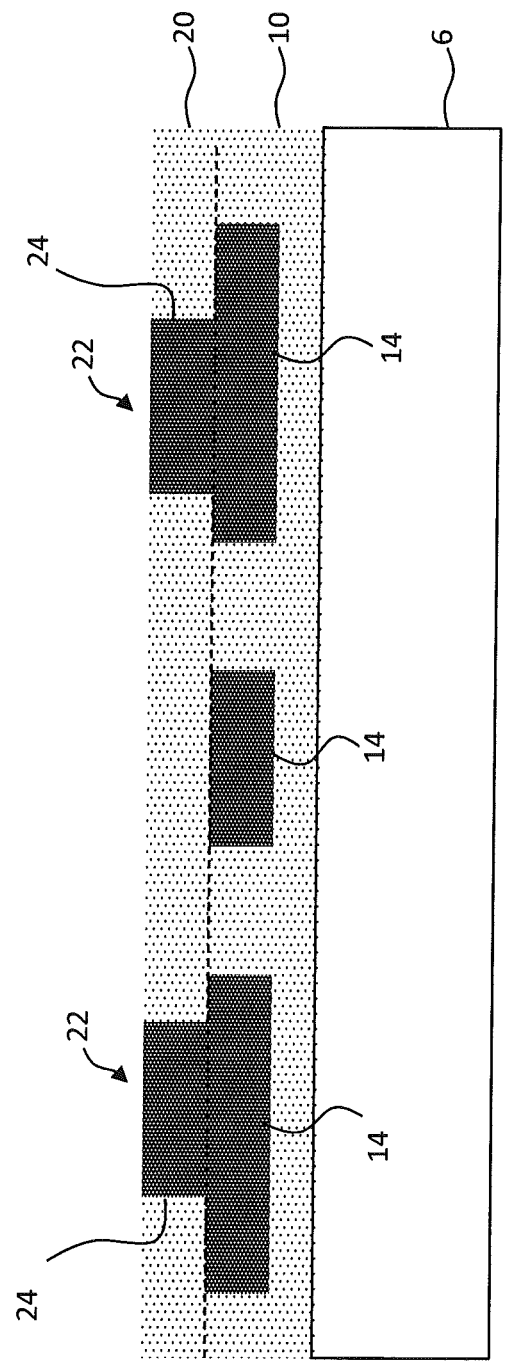
Figure 14J:
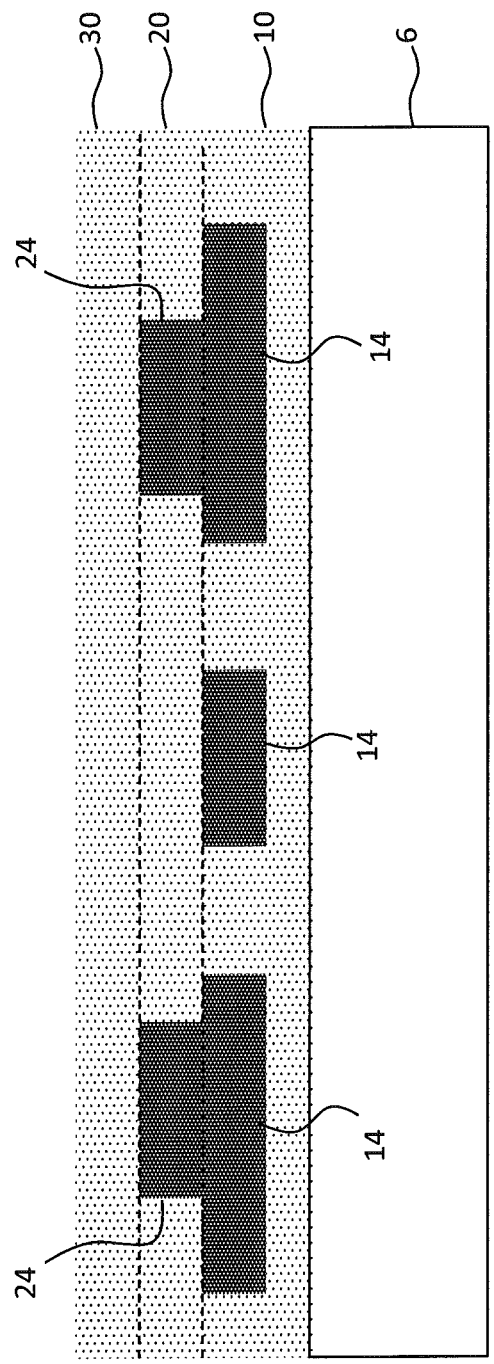
Figure 14K:
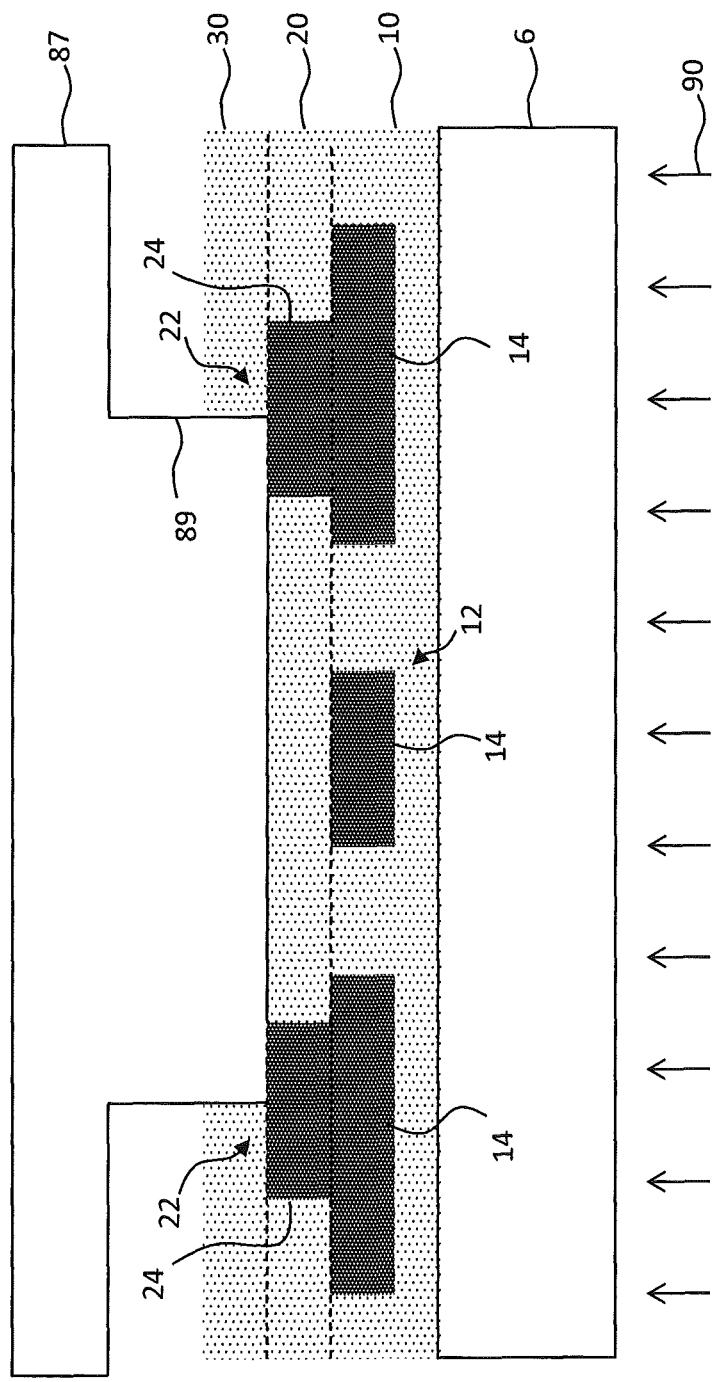
Figure 14L:
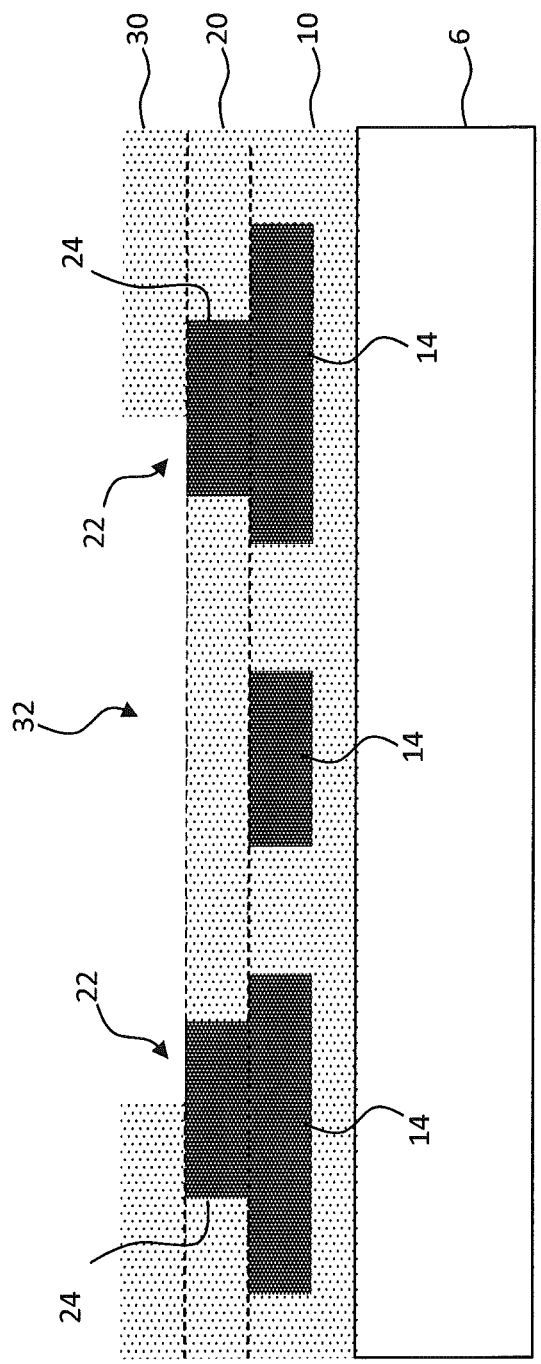
Figure 14M:
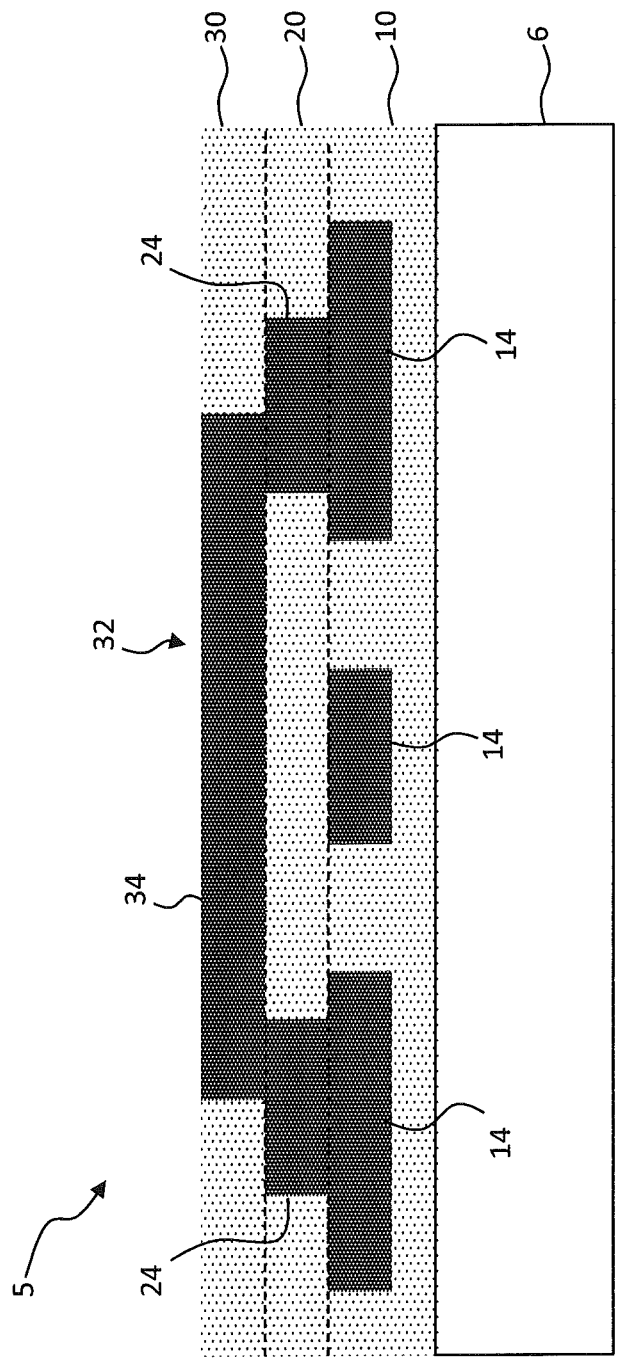
Figure 14N:
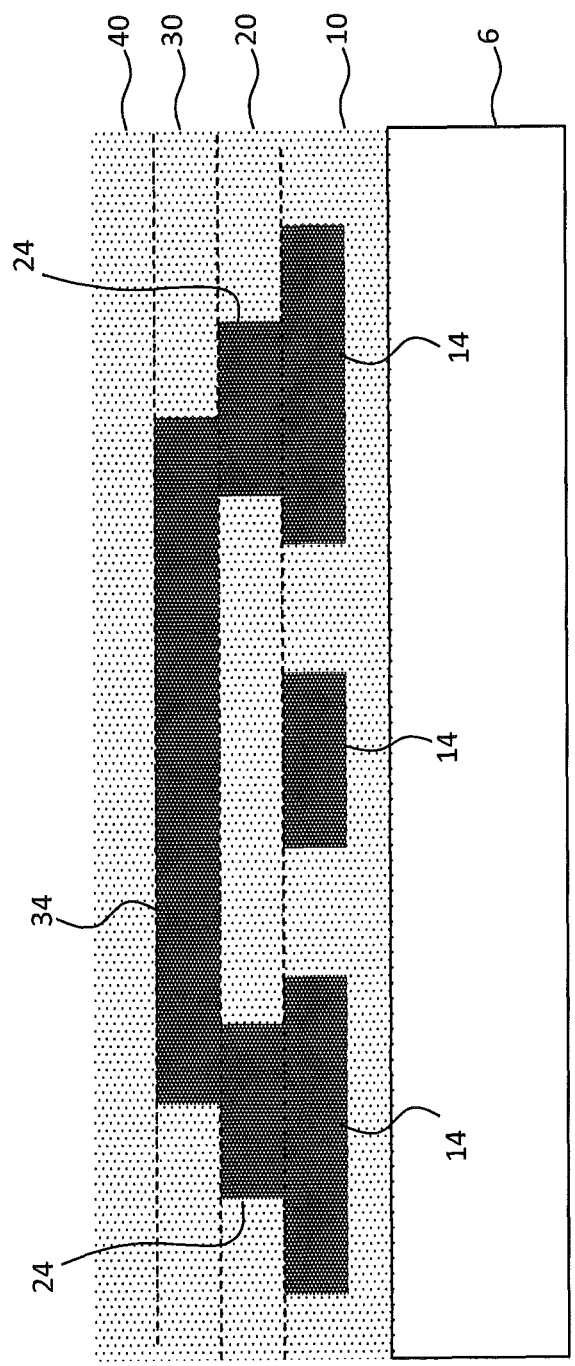
Figure 14O:
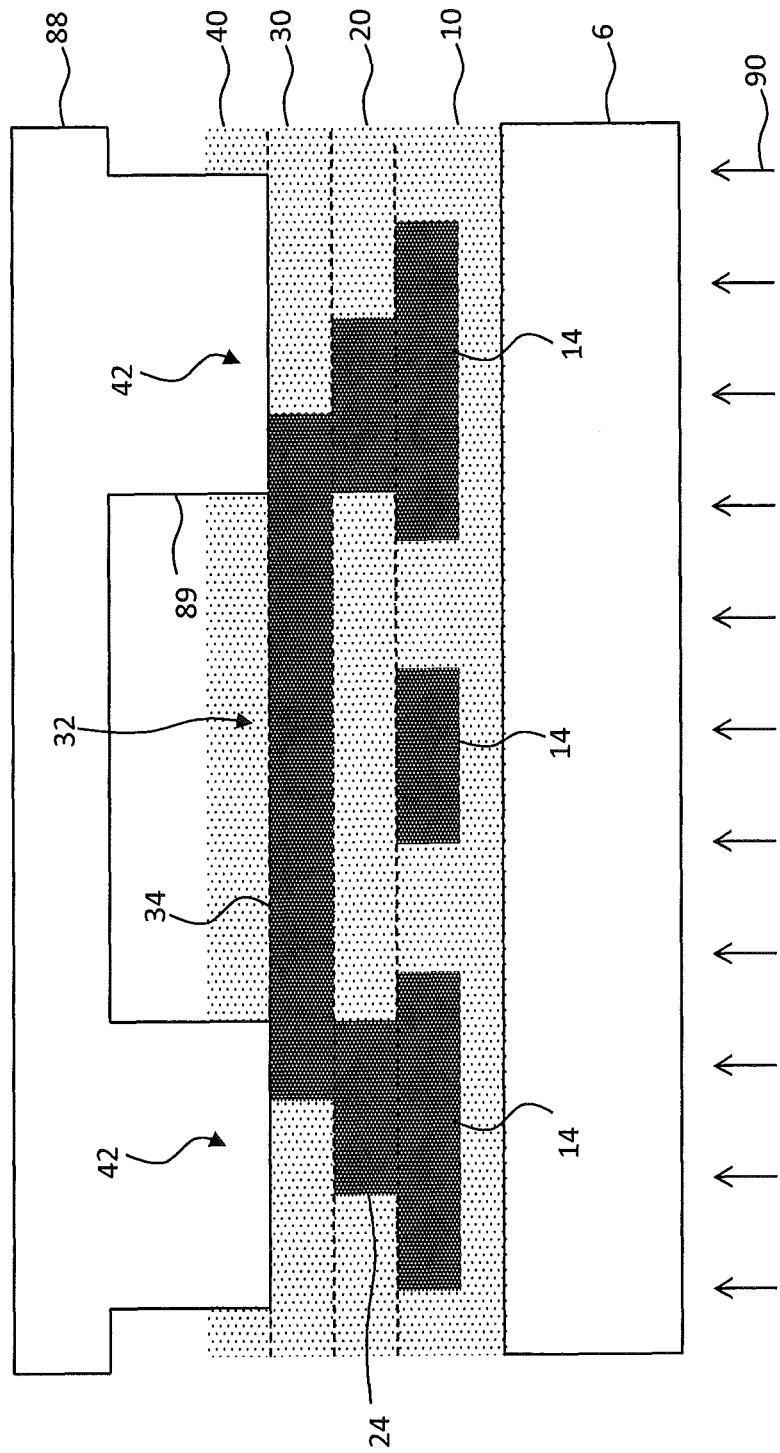
Figure 14P:
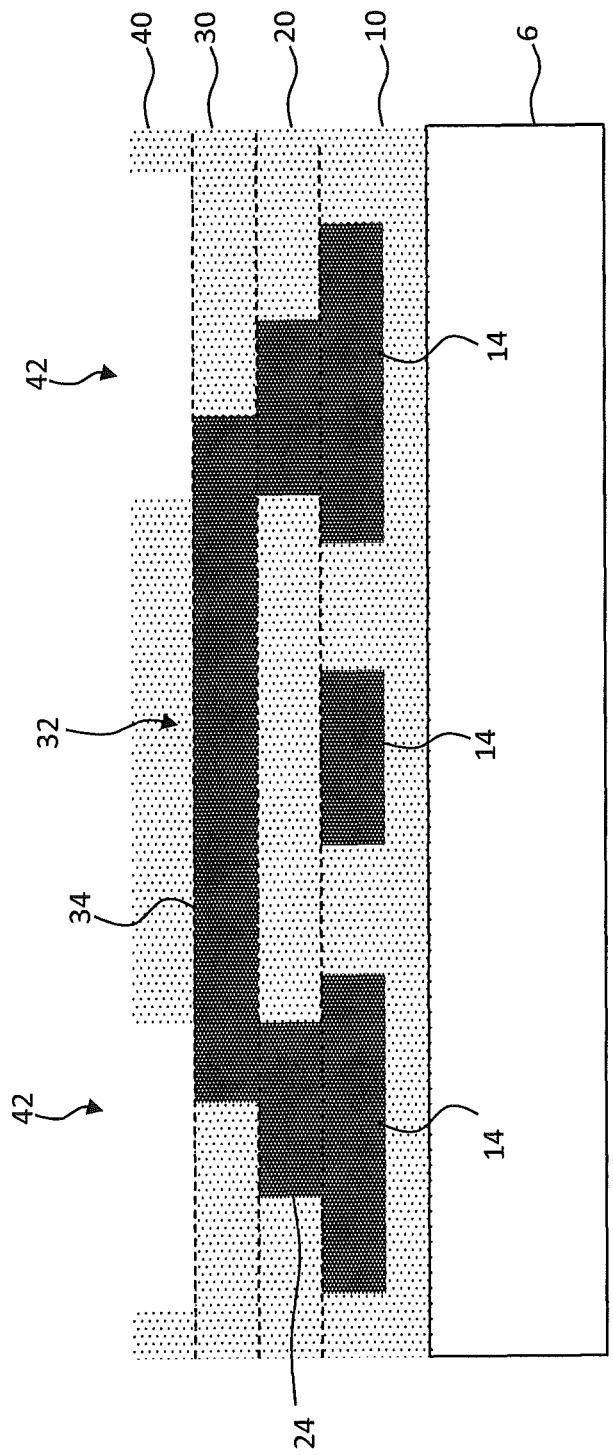
Figure 14Q:
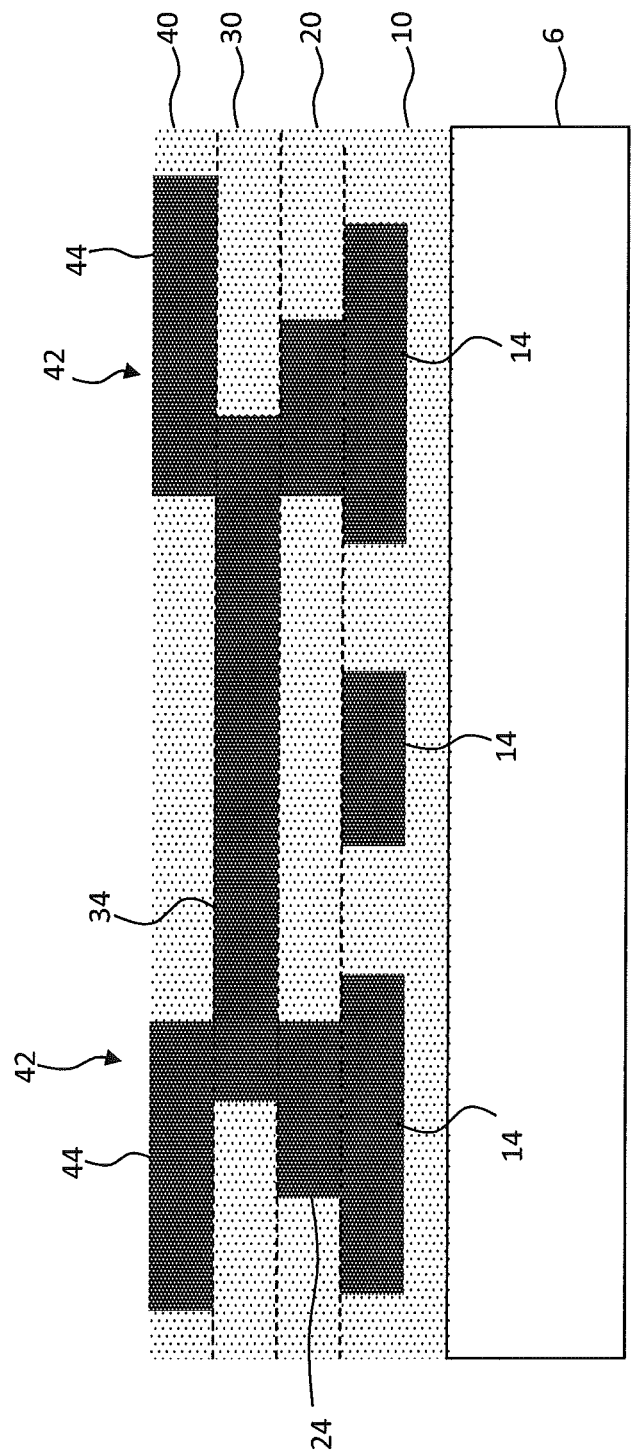

Referring to FIGS. 12 and 13 and to FIGS. 14A-14Q, in a method of the present invention, a substrate 6 as illustrated in FIG. 14A is provided in step 100. First, second, third and fourth stamps 80, 86, 87, 88 are provided in step 105. In step 110 and as illustrated in FIG. 14B, a curable first layer 10 is provided in relation to the substrate 6, for example by coating a layer of curable material on or over the substrate 6 or on or over layers formed on the substrate 6.

Referring to FIG. 14C, the first stamp 80 has one or more protrusions 89 that, when located in a curable layer, form micro-channels. The first micro-channels 12 are formed in the curable first layer 10 by at least imprinting the curable first layer 10 with the first stamp 80 located so that protrusions 89 extend into the curable first layer 10 over the substrate 6 in step 115. The curable first layer 10 is cured, for example with radiation 90, in step 120 and the first stamp 80 is removed from the cured first layer 10 (FIG. 14D) so that first micro-channels 12 are formed in the cured first layer 10 over the substrate 6.

As shown in FIG. 14E, a conductive ink is provided in the first micro-channels 12 in step 130, for example by coating the cured first layer 10 with conductive ink and wiping excess conductive ink from the surface of the cured first layer 10. The conductive ink is cured in step 135 to form the first micro-wires 14 in the first micro-channels 12 in the cured first layer 10 over the substrate 6.

Referring to FIG. 14F, a curable second layer 20 is provided in step 210 adjacent to and in contact with the cured first layer 10 and the first micro-wires 14 over the substrate 6. Referring to FIG. 14G, the curable second layer 20 is imprinted in step 215 with the second stamp 86 having a protrusion 89 located over at least a portion of the first micro-channel 12 and first micro-wire 14 to form second micro-channels 22. The curable second layer 20 is cured in step 220, for example with radiation 90, and the second stamp 86 is removed. Referring to FIG. 14H, imprinted second micro-channels 22 are formed in the cured second layer 20 over at least a portion of the first micro-channels 12 and the first micro-wires 14 formed in the cured first layer 10 over the substrate 6.

A conductive ink is provided in the second micro-channels 22 (FIG. 14I) in step 230, for example by coating the cured second layer 20 with conductive ink and wiping excess conductive ink from the surface of the cured second layer 20. The conductive ink is cured in step 235 to form the second micro-wires 24 in the second micro-channels 22 in the cured second layer 20 over the cured first layer 10 and over the substrate 6, as illustrated in FIG. 14I. A second micro-wire 24 is in electrical contact with a first micro-wire 14.

Referring next to FIG. 14J, a curable third layer 30 is provided in step 310 adjacent to and in contact with the cured second layer 20 and the second micro-wires 24. The curable third layer 30 is on a side of the cured second layer 20 opposite the cured first layer 10, the first micro-wires 14, and the substrate 6. Referring to FIG. 14K, the curable third layer 30 is imprinted in step 315 with a third stamp 87 having protrusions 89, one of which is located over at least a portion of the second micro-channel 22 and second micro-wire 24. The curable third layer 30 is cured in step 320, for example with radiation 90, and the third stamp 87 removed. Referring to FIG. 14L, an imprinted third micro-channel 32 is formed in the cured third layer 30 over the cured second layer 20 and the substrate 6, over at least a portion of the second micro-channel 22, and over at least a portion of the second micro-wire 24.

A conductive ink is provided in the third micro-channels 32 in step 330, for example by coating the cured third layer 30 with conductive ink and wiping excess conductive ink from the surface of the cured third layer 30. The conductive ink is cured in step 335 to form the third micro-wires 34 in the third micro-channels 32 in the cured third layer 30 over the cured second layer 20 and opposite the cured first layer 10 and the substrate 6, as illustrated in FIG. 14M. A third micro-wire 34 is in electrical contact with a second micro-wire 24 and a first micro-wire 14. In this embodiment, a different first micro-wire 14 is electrically isolated from the second micro-wires 24 and the third micro-wires 34.

Referring next to FIG. 14N, a curable fourth layer 40 is provided in step 410 adjacent to and in contact with the cured third layer 30 and the third micro-wires 34. The curable fourth layer 40 is on or over a side of the cured third layer 30 opposite the cured first and second layers 10, 20, the first and second micro-wires 14, 24, and the substrate 6. Referring to FIG. 14O, the curable fourth layer 40 is imprinted in step 415 with a fourth stamp 88 having protrusions 89, one of which is located over at least a portion of the third micro-channels 32 and the third micro-wires 34. The curable fourth layer 40 is cured in step 420, for example with radiation 90, and the fourth stamp 88 removed. Referring to FIG. 14P, imprinted fourth micro-channels 42 are formed in the cured fourth layer 40 over the cured third layer 30 and the substrate 6, over at least a portion of the third micro-channels 32, and over at least a portion of the third micro-wires 34.

A conductive ink is provided in the fourth micro-channels 42 in step 430, for example by coating the cured fourth layer 40 with conductive ink and wiping excess conductive ink from the surface of the cured fourth layer 40. The conductive ink is cured in step 435 to form the fourth micro-wires 44 in the fourth micro-channels 42 in the cured fourth layer 40 over the cured third layer 30 and opposite the cured first and second layers 10, 20 and the substrate 6, as illustrated in FIG. 14Q. In this embodiment, a fourth micro-wire 44 is in electrical contact with first, second, and third micro-wires 14, 24, 34. A different first micro-wire 14 is electrically isolated from the second micro-wires 24, third micro-wires 34, and fourth micro-wires 44.

In a further embodiment of the present invention, the step 215 of imprinting the second layer 20 to form the imprinted second micro-channels 22 further includes contacting a first micro-wire 14 with protrusions 89 of second stamp 86. By contacting the first micro-wire 14 with the second stamp 86, material of the second layer 20 is removed from the contacted area of the first micro-wire 14 so that the second micro-wire 24 can electrically connect with the first micro-wire 14. Similarly, the steps 315 and 415 of imprinting the second and third layers 20, 30 to form the imprinted third and fourth micro-channels 32 and 42 further include contacting the second or third micro-wires 24, 34, respectively, with the protrusions 89 of the imprinting third or fourth stamps 87, 88. By contacting the underlying micro-wires with the imprinting stamps, material of the imprinted layer is removed from the contacted area of the underlying micro-wires so that the micro-wires formed in the imprinted layer can electrically connect with the micro-wires formed in an underlying layer.

Figure 20A:
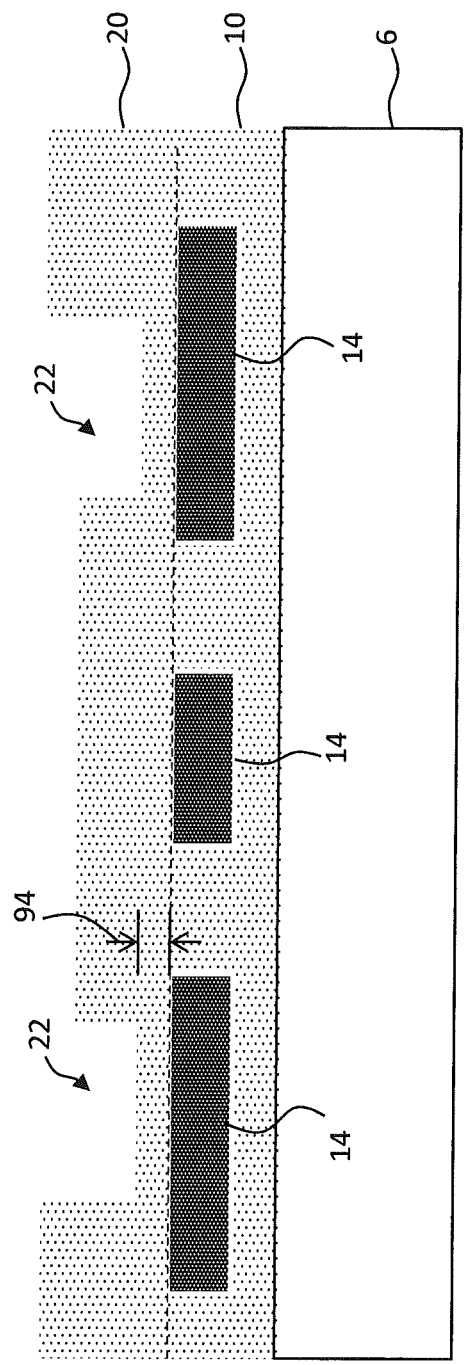
FIGS. 20A and 20B are cross sectional views illustrating an optional step in embodiments of the present invention.
Figure 20B:
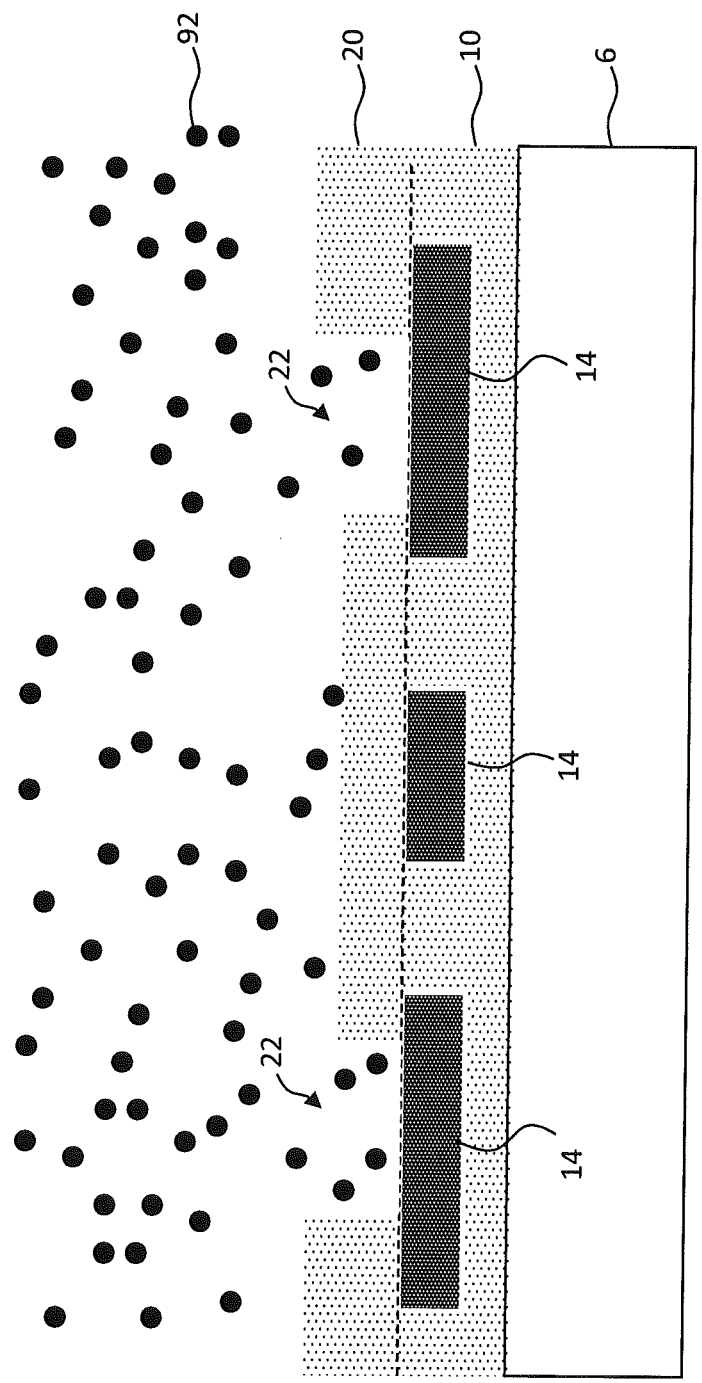

In an alternative or additional embodiment illustrated in FIGS. 20A and 20B, residual material in the second micro-channel 22 in the second layer 20 (or the third or fourth micro-channels 32, 42 in the third or fourth layer 30, 40) is removed to clear the surface of the first micro-wire 14 in the first layer 10. Referring to FIG. 20A, the first layer 10 includes the first micro-wire 14 formed over the substrate 6. The second layer 20 has imprinted second micro-channels 22 formed on the first layer 10 and the first micro-wire 14. However, as shown in FIG. 20A, it is possible that material over the first micro-wire 14 remains in the second micro-channel 22. For example, it can be difficult to exactly locate the imprinting stamps precisely in contact with an underlying layer, or it can be preferred not to, since such contact can cause deformation of the stamp or the layer that the stamp is imprinting. If this residual material stays in place, it can prevent electrical contact between the first micro-wire 14 and subsequently formed second micro-wire 24. Therefore, referring to FIG. 20B, an additional and optional step 225 (FIG. 12) is performed using a plasma 92 to treat the residual material in the second micro-channels 22. The plasma 92 contains oxygen as an etchant gas to remove the organic material. As shown in FIG. 20B, the plasma 92 removes a portion of the second layer 20 to clear the second micro-channels 22 so that portions of the first micro-wire 14 in the first layer 10 over the substrate 6 are exposed.

The use of plasma 92 to remove a portion of a layer to clear a micro-channel is optionally used after any imprinting step that forms a micro-channel over an underlying micro-wire. Thus, optional step 225 (FIG. 12) is performed after the imprinting step 215 to clear the second micro-channels 22, optional step 325 (FIG. 12) is performed after step 315 to plasma-treat and clear the third micro-channels 32, and optional step 425 (FIG. 13) is performed after step 415 (FIG. 13) to clear the fourth micro-channels 42.

The plasma 92 removes a thinning depth 94 (FIG. 20A) of the entire second layer 20 and it is therefore helpful to remove only enough of the second layer 20 to clear the second micro-channels 22 without exposing other first micro-wires 14 to avoid an electrical short between the first micro-wires 14 and any third micro-wires 34 (not shown) formed in third micro-channels 32 (not shown) over the first micro-wire 14. Thus, to prevent unwanted electrical shorts between micro-wires in adjacent layers, the thinning depth 94 is less than the difference between the depth of the cured second, third, or fourth layers 20, 30, 40 and the depth of any micro-channels in the corresponding cured second, third, or fourth layers 20, 30, 40.

In various embodiments of the present invention, the first, second, third, or fourth layers 10, 20, 30, 40 include common materials or are formed from common materials. In an embodiment, the first, second, third, or fourth layers 10, 20, 30, 40 are not distinguishable apart from the micro-channels or micro-wires formed within the first, second, third, or fourth layers 10, 20, 30, 40 and can form a common layer. In a useful embodiment any, or all, of the first, second, third, or fourth layers 10, 20, 30, 40 is cross-linked to a neighboring layer and are cured layers. For example, the first, second, third, or fourth layers 10, 20, 30, 40 are cured layers formed from a curable polymer that includes cross-linking agents that are cured with heat or exposure to radiation, such as ultra-violet radiation.

Thus, in an embodiment, the curable first layer 10 includes first curable material and the first stamp 80 is located in contact with the first curable material and the first curable material is at least or only partially cured to form the first micro-channel 12. The curable second layer 20 includes second curable material and the second stamp 86 is located in contact with the second curable material and the second curable material is at least or only partially cured to form the second micro-channel 22. The curable third layer 30 includes third curable material and the third stamp 87 is located in contact with the third curable material and the third curable material is at least or only partially cured to form the third micro-channels 32. The curable fourth layer 40 includes fourth curable material and the fourth stamp 88 is located in contact with the fourth curable material and the fourth curable material is at least or only partially cured to form the fourth micro-channels 42.

Furthermore, according to embodiments of the present invention, the first layer 10 is cross linked to the second layer 20 by only partially curing the first layer 10 in step 120 (FIG. 12) and further curing both the first layer 10 and the second layer 20 in step 220 (FIG. 12). It is also possible to cross link the second layer 20 to the third layer 30 by only partially curing the second layer 20 in step 220 and further curing both the second layer 20 and the third layer 30 in step 320 (FIG. 12). Similarly, it is possible to cross link the third layer 30 to the fourth layer 40 by only partially curing the third layer 30 in step 320 and further curing both the third layer 30 and the fourth layer 40 in step 420 (FIG. 13).

When two adjacent layers include similar or the same materials and the materials in the adjacent layers are cross linked to each other, the adjacent layers can be indistinguishable or inseparable. Thus, adjacent cross-linked layers can form a single layer and the present invention includes single layers that include multiple cross-linked sub-layers within the single layer. The multiple sub-layers can be coated with similar materials in separate operations and then form a single layer that is cured or cross-linked in a single, common step.

In further embodiments of the present invention, the first, second, third, fourth, multi-level second, or multi-level third micro-wires 14, 24, 34, 44, 27, 37 are cured micro-wires, for example a cured conductive ink. In an embodiment, a common conductive ink is used for any of the first, second, third, fourth, multi-level second, or multi-level third micro-wires 14, 24, 34, 44, 27, 37 so that they include common materials or are formed from common materials. Useful, cured conductive inks can include electrically conductive particles, for example, silver nano-particles that are sintered, welded, or agglomerated together.

In an embodiment, two or more of the electrically connected first, second, third, fourth, multi-level second, or multi-level third micro-wires 14, 24, 34, 44, 27, 37 form a common micro-wire so that electrically conductive particles in the first, second, third, fourth, multi-level second, or multi-level third micro-wires 14, 24, 34, 44, 27, 37 are sintered, welded, or agglomerated together. Such a structure is formed if electrically connected micro-wires are coated as a curable conductive ink and at least partially cured in a common step.

The micro-wires in each layer are formed by coating the layer with a conductive ink, removing excess ink from the surface of the layer, leaving ink in the micro-channels in the layer, and then curing the conductive ink to form a micro-wire. In some cases, removing excess ink from the surface of the layer can also remove ink from the micro-channels. Therefore, in a further embodiment, conductive ink is deposited in the first micro-channels 12, the second micro-channels 22, the third micro-channels 32, or the fourth micro-channels 42 a second time. Conductive ink located in a micro-channel a first time can be partially cured before locating conductive ink in the micro-channel a second time, and the conductive inks cured together in a second curing step to form a single micro-wire.

Therefore, a method of the present invention includes depositing conductive ink in the first micro-channel 12 and at least or only partially curing the conductive ink to form the first micro-wire 14, further includes depositing conductive ink in the second micro-channel 22 and at least or only partially curing the conductive ink to form the second micro-wire 24, further includes depositing conductive ink in the third micro-channel 32 and at least or only partially curing the conductive ink to form the third micro-wire 34, or further includes depositing conductive ink in the fourth micro-channel 42 and at least or only partially curing the conductive ink to form the fourth micro-wire 44.

According to another embodiment, conductive inks located in micro-channels in different layers that are in contact are cured in a common step to form a single micro-wire that extends through multiple micro-channels or multiple layers. Thus, two or more of the fourth micro-wires 44, the third micro-wires 34, the second micro-wires 24, and the first micro-wires 14 are at least partially cured in a single step to form a single micro-wire. Furthermore, if the conductive ink includes electrically conductive particles, the electrically conductive particles in the fourth micro-wires 44, the third micro-wires 34, the second micro-wires 24, or the first micro-wires 14 and the electrically conductive particles in micro-wires in a neighboring layer are sintered, welded, or agglomerated together in a single curing step.

Therefore, a method of the present invention can include depositing first conductive ink in the first micro-channel 12 and only partially curing the first conductive ink to form the first micro-wire 14, depositing second conductive ink in the second micro-channel 22 and at least partially curing both the first and the second conductive inks at the same time to form the first micro-wire 14 and the second micro-wire 24. The first and second conductive inks can include electrically conductive particles and the electrically conductive particles in the first conductive ink are sintered, welded, or agglomerated to the electrically conductive particles in the second conductive ink. Similarly, second, third, or fourth conductive inks deposited in corresponding second, third, or fourth micro-channels 22, 32, 42 are at least partially cured at the same time to form corresponding second, third, or fourth micro-wires 24, 34, 44.

Figure 15:
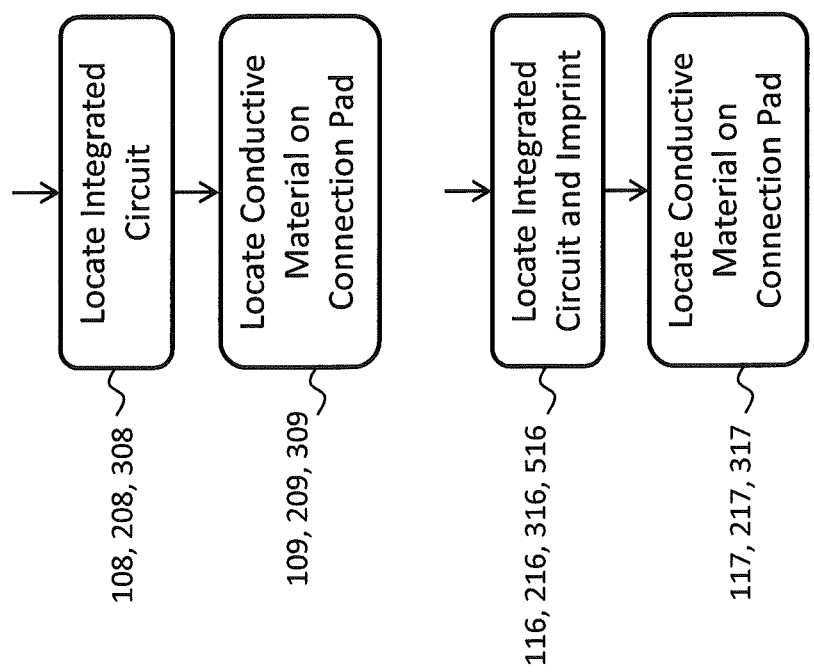
FIG. 15 is a flow diagram illustrating other methods of the present invention.

In further embodiments of the present invention, referring to FIG. 15, integrated circuits 70 are located on the substrate 6 or any of the first, second, or third layers 10, 20, 30 in steps 108, 208, 308. For example, integrated circuits are located using pick-and-place or printing technology used in printed circuit board manufacturing. Conductive material, such as solder, conductive adhesives, or anisotropic conductive material are located on connection pads 74 in steps 109, 209, 309 for integrated circuits 70 located on the substrate 6 or any of the first, second, or third layers 10, 20, 30.

Figure 16:
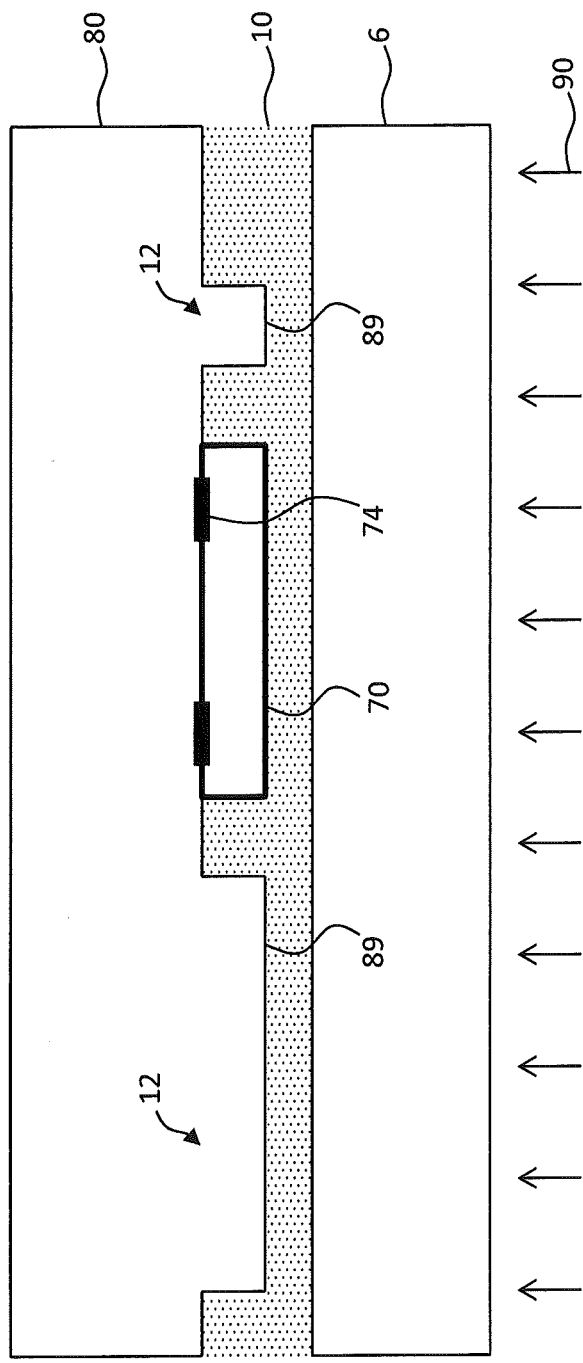
FIG. 16 is a cross sectional view illustrating an imprinting step with an integrated circuit useful in a method of the present invention.

Alternatively, integrated circuits 70 are located on any of the first, second, or third layers 10, 20, 30 in steps 116, 216, 316 in a common step with the micro-channel imprinting. Referring also to FIG. 16, in an embodiment a first stamp 80 forms the first micro-channels 12 in the first layer 10 on the substrate 6 with the protrusions 89. An integrated circuit 70 having a connection pad 74 is adhered to the first stamp 80, for example with vanderWaal's forces, and located on the first layer 10 at the same time. In an embodiment, curable first layer 10 is at least somewhat adhesive so that the integrated circuit 70 adheres to the first layer 10 when the first stamp 80 is removed. Integrated circuit 70 is adhered to the first stamp 80 by contacting the integrated circuit 70 with the appropriate portion of the first stamp 80 when the integrated circuit 70 is located on or fastened to a separate surface having less adhesion than the adhesion formed between the first stamp 80 and the integrated circuit 70. The integrated circuit 70 is cured in place together with the first micro-channels 12, for example by radiation 90, so that the integrated circuit 70 is permanently adhered to the first layer 10. Similarly, integrated circuits 70 can be located and adhered to other layers using various imprinting stamps. Conductive material, such as solder, conductive adhesives, or anisotropic conductive material are located on connection pads 74 in steps 117, 217, 317 (FIG. 15) for integrated circuits 70 located on the substrate 6 or any of the first, second, or third layers 10, 20, 30 after the corresponding first, second, or third layers 10, 20, 30 is imprinted.

The embodiments of the present invention illustrated in FIGS. 14A-14Q use four stamps to imprint four layers of micro-channels in four steps as well as using four separate steps to form the micro-wires in the micro-channels formed in the various layers. According to another embodiment of the present invention, a multi-level second stamp 82 (FIG. 18G) is used to form two levels of the imprinted multi-level micro-wire structure 5 in a single, common step at the same time. In any case, stamps can be made of, or include, PDMS.

Figure 17:
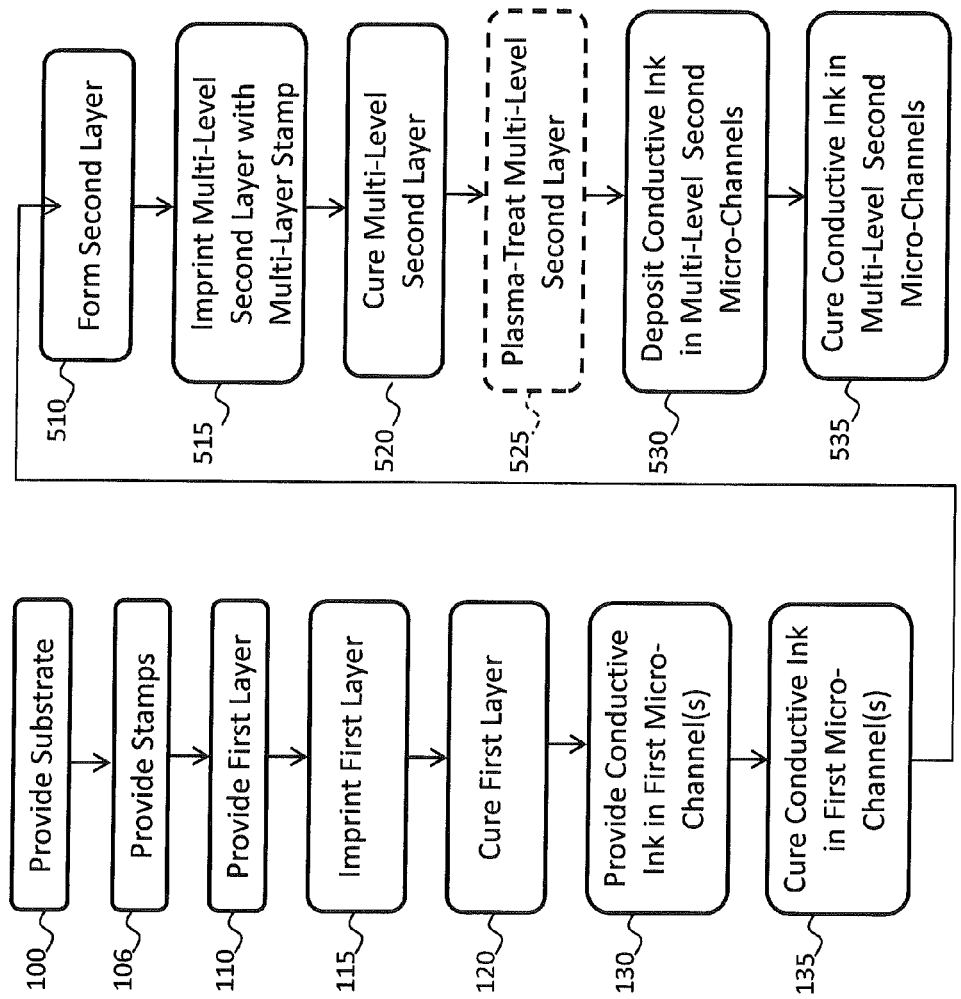
FIG. 17 is a flow diagram illustrating a method of the present invention.
Figure 18C:
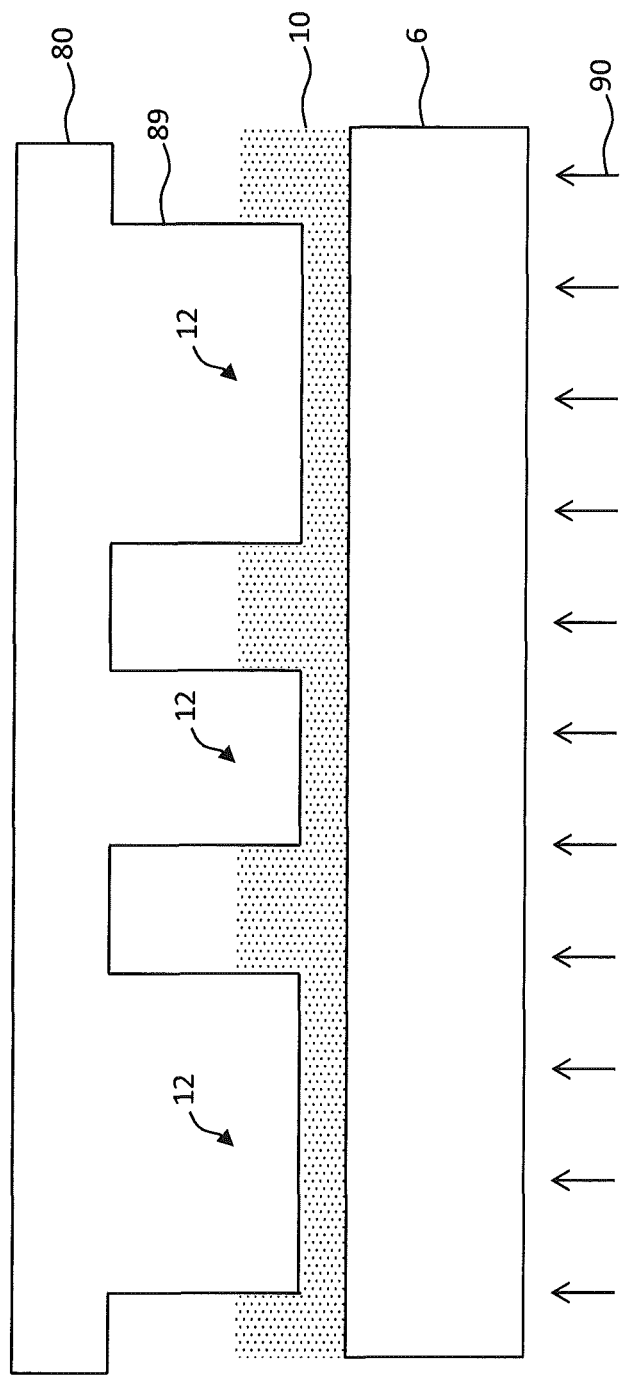
Figure 18F:
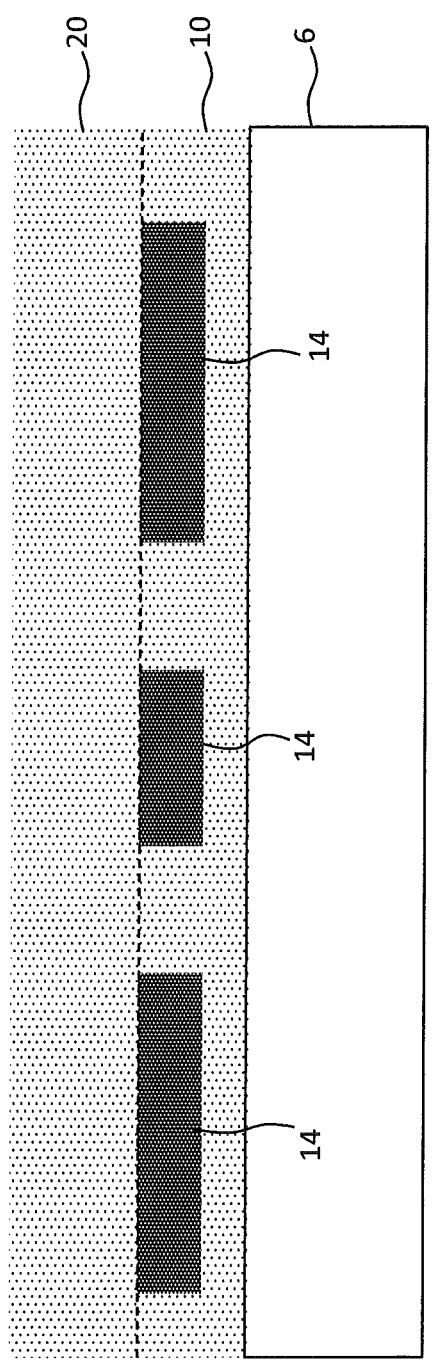

Referring to FIG. 17 and to FIGS. 18A-18I, another method of making an imprinted multi-level micro-wire structure 5 includes providing a substrate 6 (FIG. 18A) in step 100. A first stamp 80 and a different multi-level second stamp 82 (FIG. 18G) are provided in step 106. A curable first layer 10 is provided over the substrate 6 in step 110 (FIG. 18B). The curable first layer 10 on the substrate 6 is imprinted with the first stamp 80 (step 115) having protrusions 89 and cured (step 120), for example with radiation 90, as illustrated in FIG. 18C to form the first micro-channels 12 in the curable first layer 10 on the substrate 6 (FIG. 18D). Conductive ink is provided in the first micro-channels 12 (step 130) and cured (step 135), forming the first micro-wires 14 in the first micro-channels 12 in the first layer 10 (FIG. 14E) over the substrate 6.

A curable second layer 20 is formed adjacent to and in contact with the cured first layer 10 and the first micro-wire 14 over the substrate 6 in step 510 (FIG. 18F), for example by coating.

Figure 18G:
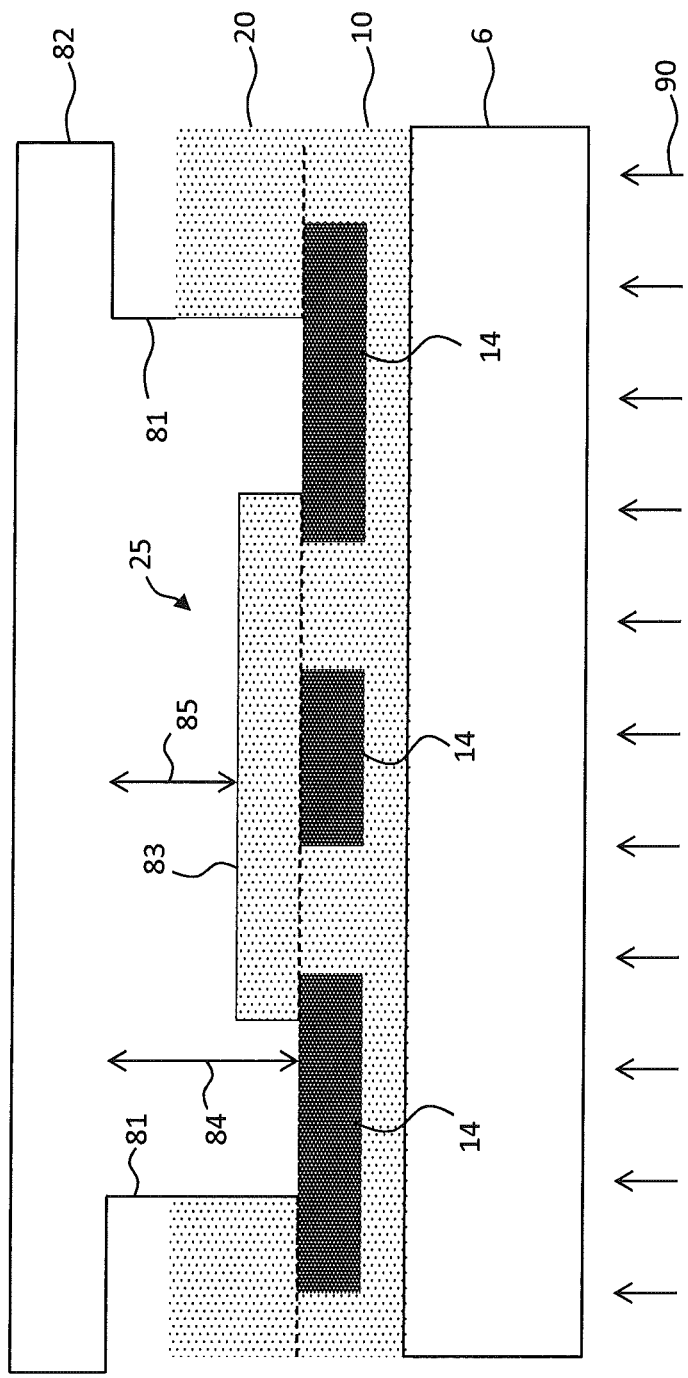

The curable second layer 20 is imprinted with the multi-level second stamp 82 in step 515 and cured in step 520 (FIG. 18G), for example with radiation 90 to form a multi-level second micro-channel 25. The multi-level second stamp 82 has at least one deep protrusion 81 having a deep-protrusion depth 84 and at least one shallow protrusion 83 having a shallow-protrusion depth 85. The deep-protrusion depth 84 is greater than the shallow-protrusion depth 85 so that when the multi-level second stamp 82 is used to imprint a multi-level micro-channel pattern in a layer, the portion of the pattern corresponding to the deep protrusion 81 is deeper than the portions of the pattern corresponding to the shallow protrusions 83, as illustrated in FIG. 18G.

Figure 18H:
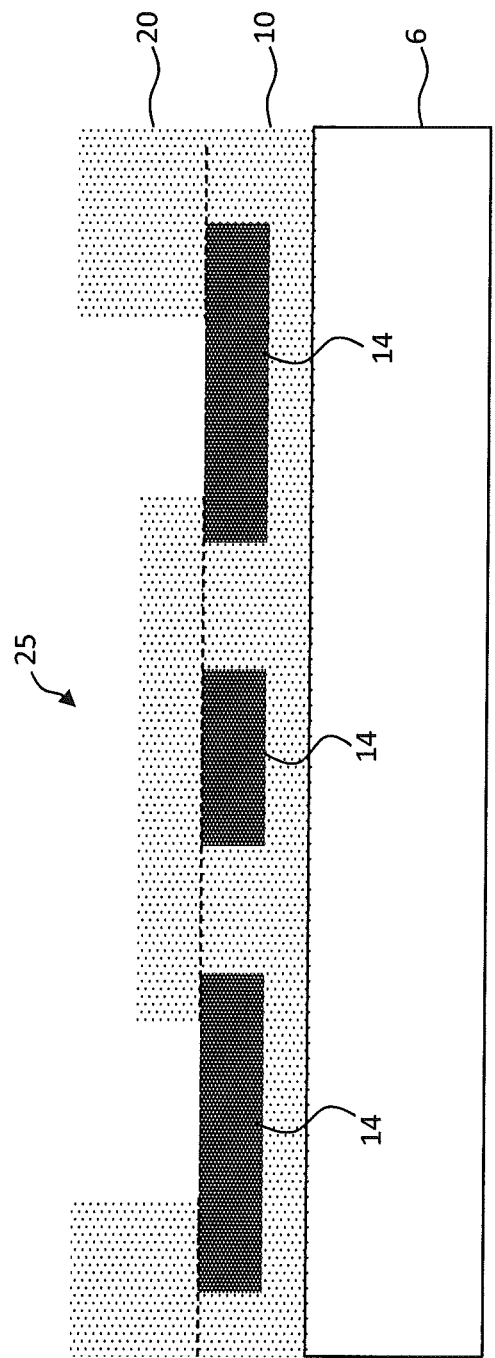

At least a portion of the multi-level second micro-channel 25 formed by the deep protrusion 81 of the multi-level second stamp 82 is located over and in contact with at least a portion of the first micro-wire 14. In an embodiment, a second micro-channel 22 (not shown) or multi-level second micro-channel 25 formed by the shallow protrusions 83 of the multi-level second stamp 82 extends over at least a portion of a first micro-wire 14 without contacting the first micro-wire 14. Referring next to FIG. 18H, the multi-level second stamp 82 (not shown) is removed after curing the second layer 20, forming a multi-level second micro-channel 25 formed over the first layer 10 and the first micro-wires 14 on the substrate 6.

Figure 18I:
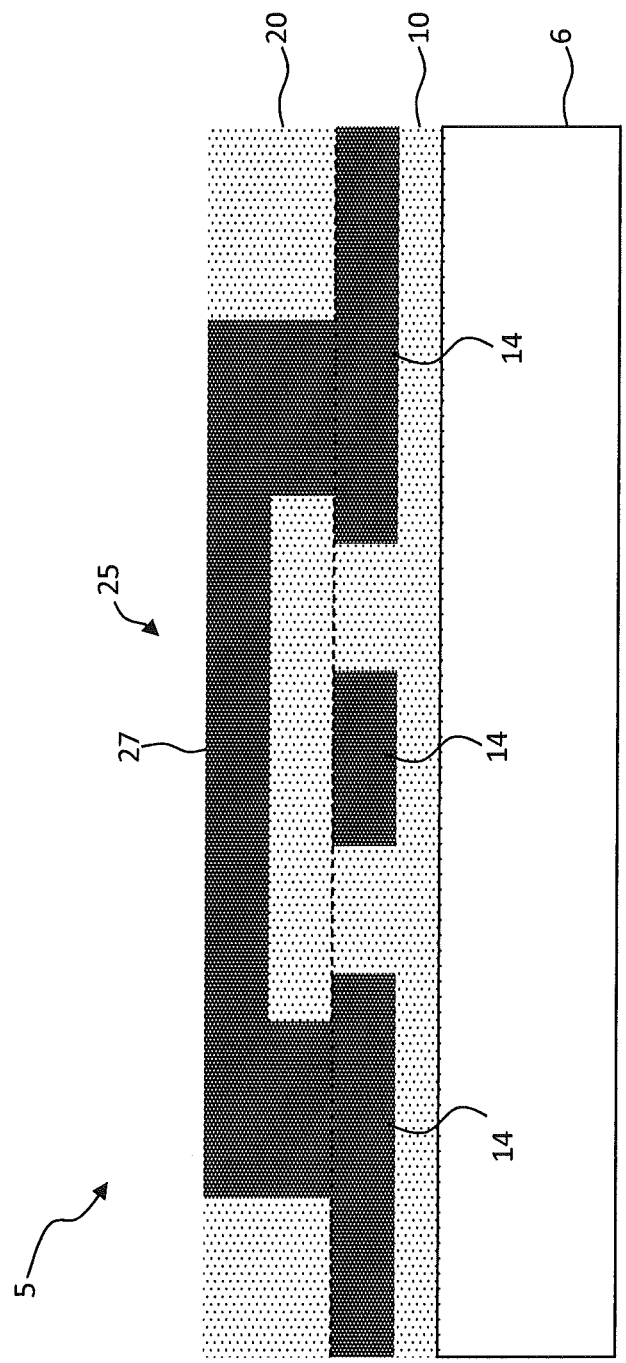

Conductive ink is deposited in the multi-level second micro-channel 25 (step 530) and cured (step 535), forming an imprinted multi-level micro-wire structure 5 having a multi-level second micro-wire 27 in the multi-level second micro-channel 25 in second layer 20, as shown in FIG. 18I. The multi-level second micro-wire 27 is electrically isolated from a first micro-wire 14 and electrically connected to other first micro-wires 14.

In one embodiment, the step 515 of forming the imprinted multi-level second micro-channel 25 in layer 20 includes contacting the first micro-wire 14 with the deep protrusion 81 of the multi-level second stamp 82. In another embodiment, as described above with respect to FIGS. 20A and 20B, a portion of the cured second layer 20 is removed, for example by treating (optional step 525) the portion of the cured second layer 20 with plasma 92. The treatment can thin the entire cured second layer 20 by a thinning depth less than the deep-protrusion depth 84 of the deep protrusion minus the shallow-protrusion depth 85 of the shallow protrusion (as illustrated in FIG. 18G).

Figure 19:
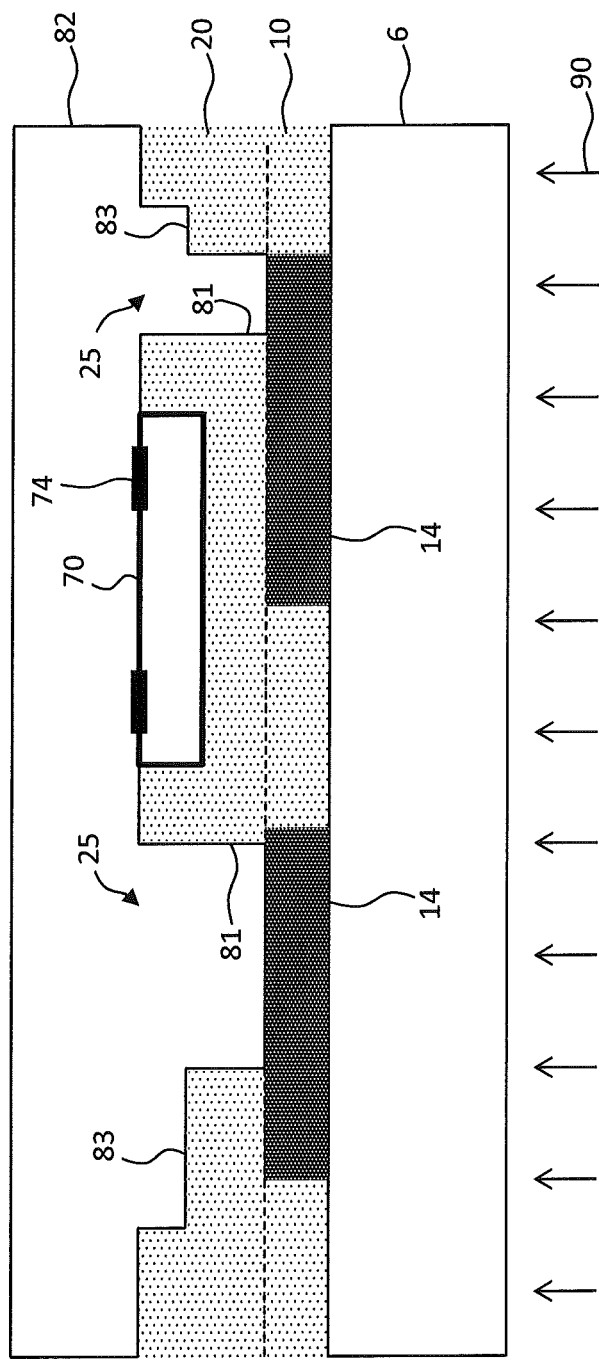
FIG. 19 is a cross sectional view illustrating another imprinting step with an integrated circuit useful in a method of the present invention.

In an embodiment, integrated circuits 70 are located on either of the first or second layers 10, 20 in steps 116, 516 (FIG. 15) in a common step with the micro-channel imprinting. Referring also to FIG. 19, in an embodiment the multi-level second stamp 82 forms multi-level second micro-channels 25 in second layer 20 on the first layer 10 and on the substrate 6 with the deep protrusions 81 and shallow protrusions 83. An integrated circuit 70 having a connection pad 74 is adhered to the multi-level second stamp 82, for example with vanderWaal's forces, and located on the second layer 10 at the same time as the multi-level second micro-channels 25 are imprinted in the second layer 20. In an embodiment, curable second layer 20 is at least somewhat adhesive so that the integrated circuit 70 adheres to the second layer 20 when the multi-level second stamp 82 is removed. The integrated circuit 70 is adhered to the multi-level second stamp 82 by contacting the integrated circuit 70 with the appropriate portion of the multi-level second stamp 82 when the integrated circuit 70 is located on or fastened to a separate surface having less adhesion than the adhesion formed between the multi-level second stamp 82 and the integrated circuit 70. The integrated circuit 70 is cured in place together with the multi-level second micro-channels 25, for example by radiation 90, so that the integrated circuit 70 is permanently adhered to the second layer 20.

In an embodiment, a cured-layer depth of the first layer 10, second layer 20, third layer 30, or fourth layer 40 has a range of about one micron to twenty microns.

The cured first layer 10, second layer 20, third layer 30, or fourth layer 40 is a layer of curable material that has been cured and, for example, formed of a curable material coated or otherwise deposited on a surface, for example a surface of the substrate 6, to form a curable layer. The substrate-coated curable material is considered herein to be curable layer before it is cured and a cured layer after it is cured. Similarly, a cured electrical conductor is an electrical conductor formed by locating a curable material in a micro-channel and curing the curable material to form the cured electrical conductor in the micro-channel. The cured electrical conductor is a micro-wire.

In various embodiments, curable layers are deposited as a single layer in a single step using coating methods known in the art, e.g. curtain coating. In an alternative embodiment, curable layers are deposited as multiple sub-layers using multi-level deposition methods known in the art, e.g. multi-level slot coating, repeated curtain coatings, or multi-level extrusion coating. In yet another embodiment, curable layers include multiple sub-layers formed in different, separate steps, for example with a multi-level extrusion, curtain coating, or slot coating as is known in the coating arts. Micro-channels are embossed and cured in curable layers in a single step and micro-wires are formed by depositing a curable conductive ink in micro-channels and curing the curable conductive ink to form an electrically conductive micro-wire.

Cured layers (e.g. the first, second, third, or fourth layers 10, 20, 30, 40) useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated, for example with exposure to radiation or heat. When a molding device, such as the first stamp 80 or multi-level second stamp 82 having an inverse micro-channel structure is applied to liquid curable material in a curable layer coated on the substrate 6 and the cross-linking agents in the curable material are activated, the liquid curable material in the curable layer is hardened into a cured layer having micro-channels with the inverse structure of the stamp. The liquid curable materials can include a surfactant to assist in controlling coating. Materials, tools, and methods are known for embossing coated liquid curable materials to form cured layers having conventional single-layer micro-channels.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels and cured, for example by heating or exposure to radiation such as infra-red, visible light, or ultra-violet radiation. The curable ink hardens to form the cured ink that makes up micro-wires. For example, a curable conductive ink with conductive nano-particles is located within micro-channels and heated to agglomerate or sinter the nano-particles, thereby forming an electrically conductive micro-wire. Materials, tools, and methods are known for coating liquid curable inks to form micro-wires in conventional single-layer micro-channels. The curable conductive ink is not necessarily electrically conductive before it is cured.

It has been experimentally demonstrated that micro-channels having a width of four microns formed in a cured layer with a depth having a range of about four microns to twelve microns over a conductive layer are filled with liquid curable conductive inks containing silver nano-particles and cured with heat to form micro-wires that conduct-electricity to the conductive layer, thus enabling electrical conduction between separate micro-wires in a cured layer through the conductive layer. Oxygen plasmas that thin the cured layer by two to eight microns have been shown to enable the formation of micro-wires that are in electrical contact with the underlying conductive layer. It has also been experimentally demonstrated that first micro-wires 14 formed in first micro-channels 12 in a first layer 10 are contacted with second micro-wires 24 formed in second micro-channels 22 in a second layer 20 coated over the first layer 10 to form an electrically continuous conductive multi-level micro-structure.

According to various embodiments of the present invention, the substrate 6 is any material having a surface on which a cured layer is formed. The substrate 6 is a rigid or a flexible substrate made of, for example, a glass, metal, plastic, or polymer material, is transparent, and can have opposing substantially parallel and extensive surfaces. Substrates 6 can include a dielectric material useful for capacitive touch screens and can have a wide variety of thicknesses, for example 10 microns, 50 microns, 100 microns, 1 mm, or more. In various embodiments of the present invention, the substrates 6 are provided as a separate structure or are coated on another underlying substrate, for example by coating a polymer substrate layer on an underlying glass substrate.

The substrate 6 can be an element of other devices, for example the cover or substrate of a display or a substrate, cover, or dielectric layer of a touch screen. In an embodiment, a substrate 6 of the present invention is large enough for a user to directly interact therewith, for example using an implement such as a stylus or using a finger or hand. Methods are known in the art for providing suitable surfaces on which to coat a single curable layer. In a useful embodiment, substrate 6 is substantially transparent, for example having a transparency of greater than 90%, 80% 70% or 50% in the visible range of electromagnetic radiation.

Electrically conductive micro-wires and methods of the present invention are useful for making electrical conductors and busses for transparent micro-wire electrodes and electrical conductors in general, for example as used in electrical busses. A variety of micro-wire or micro-channel patterns can be used and the present invention is not limited to any one pattern. Micro-wires can be spaced apart, form separate electrical conductors, or intersect to form a mesh electrical conductor on or in a layer. Micro-channels can be identical or have different sizes, aspect ratios, or shapes. Similarly, micro-wires can be identical or have different sizes, aspect ratios, or shapes. Micro-wires can be straight or curved.

In some embodiments, a micro-channel is a groove, trench, or channel formed in a cured layer and having a cross-sectional width less than 20 microns, for example 10 microns, 5 microns, 4 microns, 3 microns, 2 microns, 1 micron, or 0.5 microns, or less. In an embodiment, a micro-channel depth is comparable to a micro-channel width. Micro-channels can have a rectangular cross section, as shown in the Figures. Other cross-sectional shapes, for example trapezoids, are known and are included in the present invention. The width or depth of a layer is measured in cross section.

In various embodiments, cured inks can include metal particles, for example nano-particles. The metal particles are sintered to form a metallic electrical conductor. The metal nano-particles are silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier is located in micro-channels and heated or dried to remove liquid carrier or treated with hydrochloric acid, leaving a porous assemblage of conductive particles that are agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In various embodiments of the present invention, micro-channels or micro-wires have a width less than or equal to 10 microns, 5 microns, 4 microns, 3 microns, 2 microns, or 1 micron. In an example and non-limiting embodiment of the present invention, each micro-wire is from 10 to 15 microns wide, from 5 to 10 microns wide, from one micron to five microns wide or from one/half micron to one micron wide. In some embodiments, micro-wires can fill micro-channels; in other embodiments micro-wires do not fill micro-channels. In an embodiment, micro-wires are solid; in another embodiment micro-wires are porous.

Micro-wires can include metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials can be used. Alternatively, micro-wires can include cured or sintered metal particles such as nickel, tungsten, silver, gold, titanium, or tin or alloys such as nickel, tungsten, silver, gold, titanium, or tin. Conductive inks are used to form micro-wires with pattern-wise deposition or pattern-wise formation followed by curing steps. Other materials or methods for forming micro-wires, such as curable ink powders including metallic nano-particles, can be employed and are included in the present invention.

Electrically conductive micro-wires of the present invention can be operated by electrically connecting micro-wires through connection pads and electrical connectors to electrical circuits that provide electrical current to micro-wires and can control the electrical behavior of micro-wires. Electrically conductive micro-wires of the present invention are useful, for example in touch screens such as projected-capacitive touch screens that use transparent micro-wire electrodes and in displays. Electrically conductive micro-wires can be located in areas other than display areas, for example in the perimeter of the display area of a touch screen, where the display area is the area through which a user views a display.

In operation, electrically interconnected micro-wires of the present invention in different layers are electrically controlled by a controller. Electrical signals are provided to any integrated circuits 70 to process information, control sensors, or respond to sensors. Integrated circuits 70 and electrical circuits are generally well known in the computing arts.

Integrated circuits 70 can have a crystalline substrate to provide higher performance active components than are found in, for example, thin-film amorphous or polycrystalline silicon devices. Integrated circuits 70 can have a thickness preferably of 100 um or less, and more preferably 20 um or less. This facilitates formation of the adhesive and planarization material over the integrated circuits 70 that can then be applied using conventional spin-coating techniques. According to one embodiment of the present invention, the integrated circuits 70 formed on crystalline silicon substrates are arranged in a geometric array and adhered to a device substrate (e.g. 6) with adhesion or planarization materials. Connection pads 74 on the surface of the integrated circuits 70 are employed to connect each the integrated circuits 70 to signal wires, power busses, or micro-wires.

In an embodiment, the integrated circuits 70 are formed in a semiconductor substrate and the circuitry of the integrated circuits 70 is formed using modern lithography tools. With such tools, feature sizes of 0.5 microns or less are readily available. For example, modern semiconductor fabrication lines can achieve line widths of 90 nm or 45 nm and can be employed in making the integrated circuits 70 of the present invention. The integrated circuits 70, however, also requires connection pads 74 for making electrical connection to the micro-wires once the integrated circuits 70 are assembled onto the substrate 6. The connection pads 74 can be sized based on the feature size of the lithography tools used on the substrate 6 (for example 5 um) and the alignment of the integrated circuits 70 to the micro-wires (for example +/−5 um). Therefore, the connection pads 74 can be, for example, 15 um wide with 5 um spaces between the pads. This means that the pads will generally be significantly larger than the transistor circuitry formed in the integrated circuits 70.

The pads can generally be formed in a metallization layer on the chiplet over the transistors. It is desirable to make the chiplet with as small a surface area as possible to enable a low manufacturing cost.

By employing the integrated circuits 70 with independent substrates (e.g. comprising crystalline silicon) having circuitry with higher performance than circuits formed directly on the substrate 6 (e.g. amorphous or polycrystalline silicon), a device with higher performance is provided. Since crystalline silicon has not only higher performance but also much smaller active elements (e.g. transistors), the circuitry size is much reduced.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 first direction
D2 second direction
5 imprinted multi-level micro-wire structure
6 substrate
7 visible area
8 central area
9 edge area
10 first layer
12 first micro-channel
14 first micro-wire
20 second layer
22 second micro-channel
24 second micro-wire
25 multi-level second micro-channel
26 first-level micro-wire portion
27 multi-level second micro-wire
28 second-level micro-wire portion
30 third layer
32 third micro-channel
34 third micro-wire
35 multi-level third micro-channel
37 multi-level third micro-wire
40 fourth layer
42 fourth micro-channel
44 fourth micro-wire
50 radiation-active element
52 interactive elements
60 wires
62 buss
64 controller
66 electrodes
70 integrated circuit
72 integrated circuit substrate
74 connection pad
80 first stamp
81 deep protrusion
82 multi-level second stamp
83 shallow protrusion
84 deep-protrusion depth
85 shallow-protrusion depth
86 second stamp
87 third stamp
88 fourth stamp
89 protrusion
90 radiation
92 plasma
94 thinning depth
100 provide substrate step
105 provide stamps step
106 provide stamps step
108 locate integrated circuit step
109 locate conductive material on connection pad step
110 provide first layer step
115 imprint first layer to form first micro-channels step
116 locate integrated circuit and imprint first micro-channels step
117 locate conductive material on connection pad step
120 cure first layer step
130 provide conductive ink in first micro-channels step
135 cure conductive ink in first micro-channels step
208 locate integrated circuit step
209 locate conductive material on connection pad step
210 provide second layer step
215 imprint second layer to form second micro-channels step
216 locate integrated circuit and imprint second micro-channels step
217 locate conductive material on connection pad step
220 cure second layer step
225 optional plasma-treat second micro-channels step
230 provide conductive ink in second micro-channels step
235 cure conductive ink in second micro-channels step
308 locate integrated circuit step
309 locate conductive material on connection pad step
310 form third layer step
315 imprint third layer to form third micro-channels step
316 locate integrated circuit and imprint third micro-channels step
317 locate conductive material on connection pad step
320 cure third layer step
325 optional plasma-treat third micro-channels step
330 provide conductive ink in third micro-channels step
335 cure conductive ink in third micro-channels step 410 provide fourth layer step
415 imprint fourth layer to form fourth micro-channels step
420 cure fourth layer step
425 optional plasma-treat fourth micro-channels step
430 provide conductive ink in fourth micro-channels step
435 cure conductive ink in fourth micro-channels step
510 form multi-level second layer step
515 imprint multi-level second micro-channels in second layer with multi-level stamp step
516 locate integrated circuit and imprint multi-level second micro-channels step
520 cure multi-level micro-channels in second layer step
525 optional plasma-treat multi-level second micro-channels step
530 deposit conductive ink in multi-level micro-channels step
535 cure conductive ink in multi-level micro-channels step

The invention claimed is:

1. A method of making a multi-level micro-wire structure, comprising:
    forming a curable first layer over a substrate and imprinting a first pattern of first micro-channels in the first layer with a first stamp;
    curing the curable first layer to form a cured first layer having the first micro-pattern of first micro-channels imprinted in the cured first layer;
    providing a curable conductive ink in the first micro-channels and curing the curable conductive ink to form first micro-wires in the first micro-channels;
    forming a curable second layer in contact with the cured first layer and imprinting a second micro-pattern of second micro-channels in the second layer with a second stamp different from the first stamp;
    curing the curable second layer to form a cured second layer having the second micro-pattern of second micro-channels imprinted in the cured second layer, at least one of the second micro-channels formed to contact at least one first micro-wire;
    providing a curable conductive ink in the second micro-channels and curing the curable conductive ink to form second micro-wires in the second micro-channels; and
    wherein a second micro-wire in the at least one of the second micro-channels is in electrical contact with the at least one first micro-wire.

2. The method of claim 1, further including forming the first stamp so that the first micro-pattern is imperceptible to the unaided human visual system when first micro-wires are formed in the first micro-channels or further including forming the second stamp so that the second micro-pattern is imperceptible to the unaided human visual system when second micro-wires are formed in the second micro-channels.

3. The method of claim 1, further including forming the first and second stamps so that the average amount of light absorbed by the first and second micro-wires in any portion of at least one mm by one mm over a visible area of the substrate varies by less than 50% over the visible area.

4. The method of claim 1, wherein forming at least one of the second micro-channels in contact with the at least one first micro-wire further includes contacting a first micro-wire with the second stamp.

5. The method of claim 1, wherein the first and second layers include cross-linkable material and further including cross linking the cross-linkable material in the first layer to the cross-linkable material in the second layer.

6. The method of claim 1, wherein the conductive ink includes electrically conductive particles and further including sintering, welding, or agglomerating electrically conductive particles in the first micro-channels to electrically conductive particles in the second micro-channels.

7. The method of claim 1, further including:
    forming a curable third layer in contact with the cured second layer and imprinting a third micro-pattern of third micro-channels in the third layer with a third stamp;
    curing the curable third layer to form a cured third layer having the third micro-pattern of third micro-channels imprinted in the cured third layer, at least one of the third micro-channels formed to contact at least one first micro-wire or at least one second micro-wire;
    providing a curable conductive ink in the third micro-channels and curing the curable conductive ink to form third micro-wires in the third micro-channels;
    wherein the at least one of the third micro-wires is in electrical contact with the at least one first micro-wires or the at least one second micro-wires.

8. The method of claim 7, further including forming the third stamp so that a portion of the second layer that does not include a second micro-wire is located between a first micro-wire and a third micro-wire.

9. The method of claim 7, further including:
    forming a curable fourth layer in contact with the cured third layer and imprinting a fourth micro-pattern of fourth micro-channels in the fourth layer with a fourth stamp;
    curing the curable fourth layer to form a cured fourth layer having the fourth micro-pattern of fourth micro-channels imprinted in the cured fourth layer, at least one of the fourth micro-channels formed to contact at least one first micro-wire, one second micro-wire, or one third micro-wire;
    locating a curable conductive ink in the fourth micro-channels and curing the curable conductive ink to form fourth micro-wires in the fourth micro-channels;
    wherein the at least one of the fourth micro-wires is in electrical contact with the at least one first micro-wire, the at least one second micro-wire, or the at least one third micro-wire.

10. The method of claim 1, wherein the substrate is a first substrate and further including locating an integrated circuit formed on a second substrate distinct from the first substrate on a side of the first layer opposite the first substrate, wherein the integrated circuit includes a connection pad.

11. The method of claim 10, wherein imprinting a first pattern of first micro-channels in the first layer with a first stamp includes locating the integrated circuit on the side of the first layer opposite the first substrate.

12. The method of claim 11, wherein imprinting a first pattern of first micro-channels in the first layer with a first stamp includes locating a plurality of integrated circuits on the side of the first layer opposite the substrate.

13. The method of claim 10, further including electrically connecting the connection pad to a first or second micro-wire.

14. The method of claim 13, wherein curing the curable conductive ink to form first or second micro-wires in the first or second micro-channels electrically connects the connection pad to the first or second micro-wire.

15. The method of claim 13, further including providing conductive material on the connection pad that electrically connects the connection pad to the first or second micro-wire.

16. The method of claim 13, further including providing conductive material on the first or second micro-wire that electrically connects the connection pad to the first or second micro-wire.

17. The method of claim 1, wherein forming at least one of the second micro-channels in contact with the at least one first micro-wire further includes leaving a remaining portion of second-layer material on the first micro-wire by imprinting the second layer with the second stamp and then removing the remaining portion of second-layer material.

18. The method of claim 17, further including removing the remaining portion of second-layer material by treating the remaining portion with a plasma treatment.

19. The method of claim 18, further including thinning the cured second-layer by a thinning depth.

20. The method of claim 19, wherein the thinning depth is less than the difference between the depth of the cured multi-level and the depth of any micro-channels in the cured multi-level.

\* \* \* \* \*